United States Patent
Bargatin et al.

(10) Patent No.: US 10,612,138 B2
(45) Date of Patent: Apr. 7, 2020

(54) ULTRALIGHT ROBUST PLATE MATERIALS

(71) Applicant: THE TRUSTEES OF THE UNIVERSITY OF PENNSYLVANIA, Philadelphia, PA (US)

(72) Inventors: Igor Bargatin, Wynnewood, PA (US); Keivan Davami, Beaumont, TX (US)

(73) Assignee: THE TRUSTEES OF THE UNIVERSITY OF PENNSYLVANIA, Philadelphia, PA (US)

( * ) Notice: Subject to any disclaimer, the term of this patent is extended or adjusted under 35 U.S.C. 154(b) by 0 days.

(21) Appl. No.: 15/456,718

(22) Filed: Mar. 13, 2017

(65) Prior Publication Data

US 2017/0183772 A1    Jun. 29, 2017

Related U.S. Application Data

(63) Continuation-in-part of application No. PCT/US2015/050008, filed on Sep. 14, 2015.

(60) Provisional application No. 62/050,661, filed on Sep. 15, 2014.

(51) Int. Cl.
| | |
|---|---|
| *B32B 3/12* | (2006.01) |
| *C23C 16/455* | (2006.01) |
| *C23C 16/01* | (2006.01) |
| *C23C 16/12* | (2006.01) |
| *C23C 16/50* | (2006.01) |
| *H01J 37/32* | (2006.01) |

(52) U.S. Cl.
CPC ........ *C23C 16/45525* (2013.01); *C23C 16/01* (2013.01); *C23C 16/12* (2013.01); *C23C 16/45555* (2013.01); *C23C 16/50* (2013.01); *H01J 37/321* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 4,451,544 | A | 5/1984 | Kawabuchi |
| 7,282,753 | B2 | 10/2007 | Kub et al. |
| 2009/0243584 | A1 | 10/2009 | Zhang et al. |
| 2010/0248449 | A1 | 9/2010 | Hildreth et al. |
| 2013/0134528 | A1 | 5/2013 | Nguyen et al. |

(Continued)

OTHER PUBLICATIONS

Davami et al., Dec. 2015, Nature Communications, pp. 1-7.*

(Continued)

*Primary Examiner* — Seth Dumbris

(74) *Attorney, Agent, or Firm* — Baker Botts L.L.P.

(57) ABSTRACT

A nanoscale plate structure includes base plates and rib plates with nanoscale thickness and macroscopic lateral dimensions. The base plate resides in the first plane, the ribs can reside out-of-plane and form at least one strengthening rib, and additional base plates can reside in planes parallel to the first plane. The strengthening rib can be patterned such that there is no straight line path extending through a lateral dimension of the plate structure that does not intersect the at least one base plate and the at least one strengthening rib. The plates and ribs used in the structure have a thickness between about 1 nm and about 100 nm. The plate structures can be fabricated using a conformal deposition method including atomic layer deposition.

13 Claims, 26 Drawing Sheets

(56) References Cited

U.S. PATENT DOCUMENTS

2013/0224377 A1* 8/2013 Jensen ................. B01J 20/286
427/237
2015/0367253 A1* 12/2015 Kanyal ............. B01D 15/3857
422/527

OTHER PUBLICATIONS

International Search Report dated Dec. 10, 2015 in International Application No. PCT/US2015/050008.
Ketsdever et al., "Radiometric phenomena: From the 19th to the 21st century," Vacuum 86:1644-1662 (2012).
Woodruff, "The Radiometer and how it does not work," The Physics Teacher 6.7:358-363 (1968).

* cited by examiner

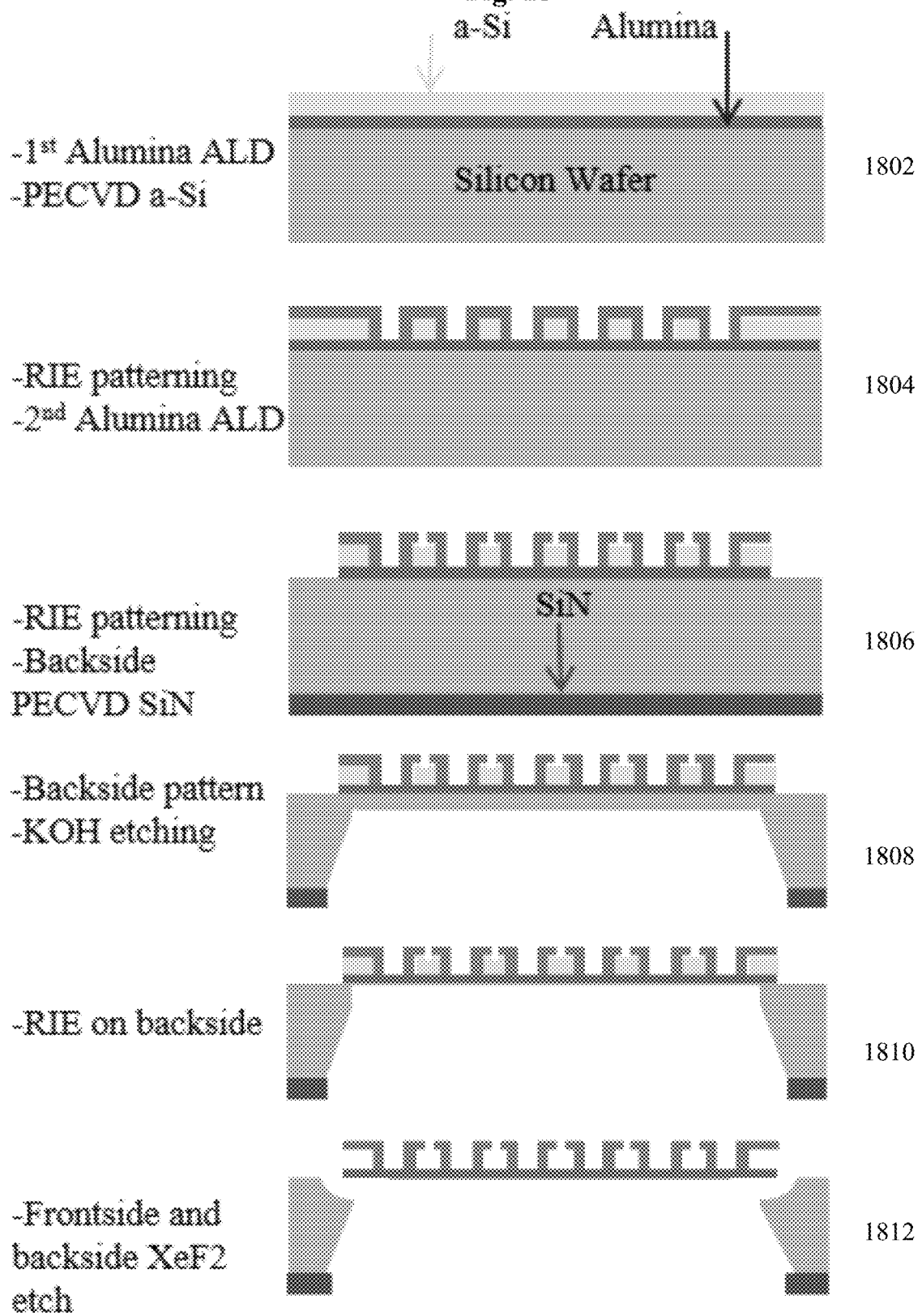

2602

ULTRALIGHT ROBUST PLATE MATERIALS

CROSS-REFERENCE TO RELATED APPLICATIONS

This application is a continuation of International Application No. PCT/US2015/050008, filed Sep. 14, 2015, which claims priority from U.S. Provisional Application Ser. No. 62/050,661, filed on Sep. 15, 2014, each of which is incorporated herein by reference in its entirety and priority to each of which is claimed.

BACKGROUND

Light-weight cellular materials can have advantageous properties for certain applications. One example of a category of light-weight materials is aerogels. Aerogels can have low densities, but can be fragile. Devices made from atomic layer deposition (ALD) films can be more flexible and have low mass. However, ALD films can be subject to warping and damage caused by large stress gradients or other forces that can exist in ultrathin films during fabrication.

At the macro scale, many types of periodic cellular plates can be used. For example, certain plates having honeycomb lattices and sandwich structures, which can include two face sheets attached to a periodic core, have been used in construction, aerospace, scientific instrumentation (e.g., optical tables), and other industries that require lightweight rigid plates. For example, paper-based corrugated cardboard structures can be an example of a macroscopic composite that includes two face sheets attached to a corrugated core. These lattice and/or sandwich structures can possess a high bending stiffness and low areal density (e.g., mass per unit area). However, macro-scale lattices and/or sandwich plates can fail to sustain sharp bending deformations without sustaining permanent damage. For example, honeycomb sandwich composites can fracture during sharp bending while paper-based corrugated cardboard structures can buckle irreversibly along the fold line and can become permanently weaker after sharp bending than before they were bent. Accordingly, there is a need for macro-scale plates that can sustain large bending deformations without permanent damage.

SUMMARY

The disclosed subject matter provides ultralight and robust plate materials.

In one aspect, the disclosed subject matter provides a plate structure including at least one base plate and rib plates. The base plate resides in a first plane. The rib plates can reside out-of-plane and form at least one strengthening rib. The strengthening rib can be patterned such that there is no straight line path extending through a lateral dimension of the plate structure that does not intersect the at least one base plate and the at least one strengthening rib. The plate structure has a thickness between about 1 nm and about 100 nm.

In another aspect, the disclosed subject matter provides a plurality of cells. Each cell includes a planar base potion and an out-of-plane rib portion. The out-of plane rib portion can be connected to out-of-plane portions of adjacent cells to form at least one strengthening rib. The at least one strengthening rib can be patterned such that there is no straight line extending through a lateral dimension of the plate structure that does not intersect the planar base portion of at least one cell and the at least one strengthening rib. The plate structure has a thickness between about 1 nm and about 100 nm.

In another aspect, the disclosed subject matter provides methods of fabricating a plate structure. In certain embodiments, a method can include providing a substrate, creating a plate structure pattern in the substrate, applying a plate structure material to the plate structure pattern, and releasing the plate structure material from the substrate. The released plate structure material forms a plate structure including at least one base plate and a plurality of rib plates. The base plate resides in a first plane. The rib plates can reside out-of-plane and form at least one strengthening rib. The strengthening rib is patterned such that there is no straight line path extending through a lateral dimension of the plate structure that does not intersect the at least one base plate and the at least one strengthening rib. The plate structure has a thickness between about 1 nm and about 100 nm.

In another aspect, the disclosed subject matter provides a plate structure including a first plate having at least one of a flat surface and a corrugated surface and a second plate having at least one of a flat surface and a corrugated surface. In some embodiments, the second plate can be offset from the first plate in at least one direction, and connected to the first plate using at least one vertical wall. In some embodiments, the first plate and the second plate can each have a thickness of less than 100 nm. In some embodiments, the first plate and the second plate can each have a plate height of between about 1 and about 100 μm.

In some embodiments, the plate structure can include one or more additional plates having at least one of a flat surface and a corrugated surface. In some embodiments, the one or more additional plates can be offset from the first plate and the second plate in the at least one plane. In some embodiments, the one or more additional plates can be connected to the first plate and the second plate using the at least one vertical wall. In some embodiments, the one or more additional plates each can have a thickness of less than 100 nm.

In some embodiments, a bending stiffness of the plate structure can be at least one order of magnitude greater than that of a single-layer planar film of the same material and thickness.

In some embodiments, a bending stiffness of the plate structure increases with an increase in plate height of at least one of the first and second plate upto a threshold value for plate height at which the bending stiffness saturates.

In some embodiments, in response to being bent, the plate structure can change internal structure by locally buckling the at least one vertical wall such that the plate structure can revert to its original shape after being bent without permanent deformations to the plate structure.

It is to be understood that both the foregoing general description and the following detailed description are exemplary and are intended to provide further explanation of the disclosed subject matter claimed.

The accompanying drawings, which are incorporated in and constitute part of this specification, are included to illustrate and provide a further understanding of the disclosed subject matter. Together with the description, the drawings serve to explain the principles of the disclosed subject matter.

BRIEF DESCRIPTION OF THE DRAWINGS

FIG. 18 is a schematic diagram illustrating an exemplary process of fabricating two-layer plates in accordance with the disclosed subject matter.

Figure 1A:
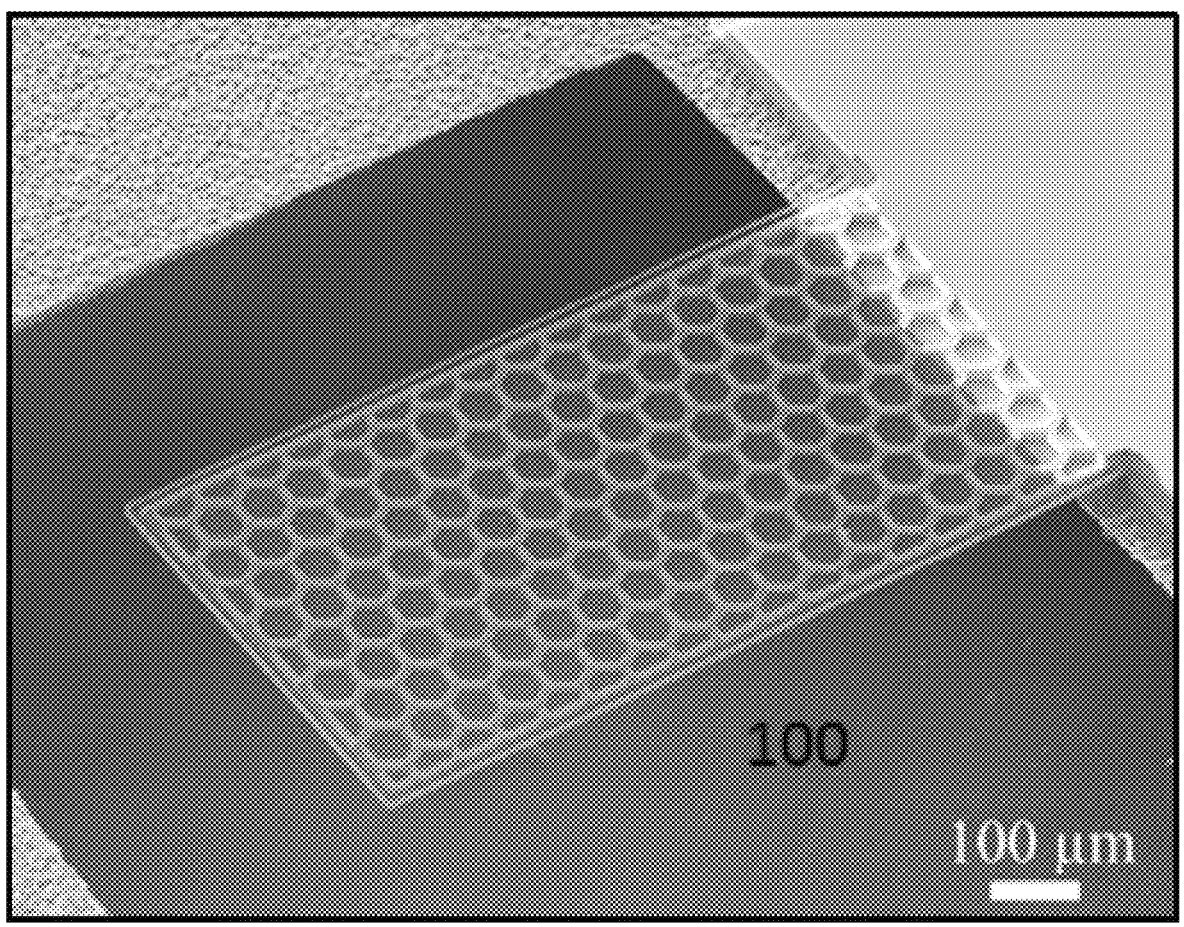
FIG. 1A illustrates a plate structure in accordance with one embodiment of the disclosed subject matter.

Throughout the drawings, the same reference numerals and characters, unless otherwise stated, are used to denote like features, elements, components or portions of the illustrated embodiments, Moreover, while the disclosed subject matter will now be described in detail with reference to the figures, it is done so in connection with the illustrative embodiments.

DETAILED DESCRIPTION

The disclosed subject matter provides ultralight and robust plate materials. For example, the disclosed subject matter provides a plate structure including base plates and rib plates forming at least one strengthening rib. The disclosed subject matter also provides techniques for fabricating plate structures using, for example, atomic layer deposition.

Figure 1B:
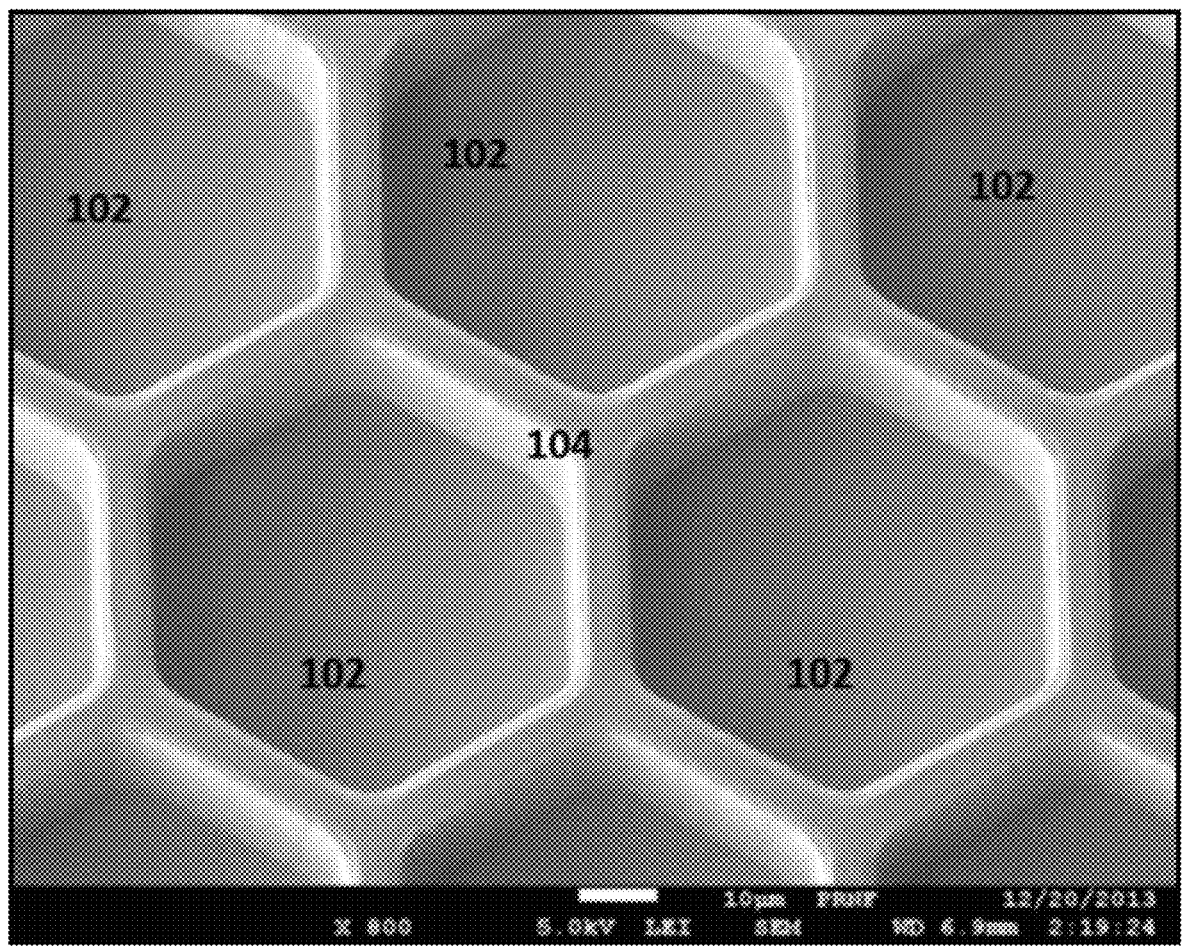
FIG. 1B illustrates a plate structure in accordance with one embodiment of the disclosed subject matter.
Figure 1C:
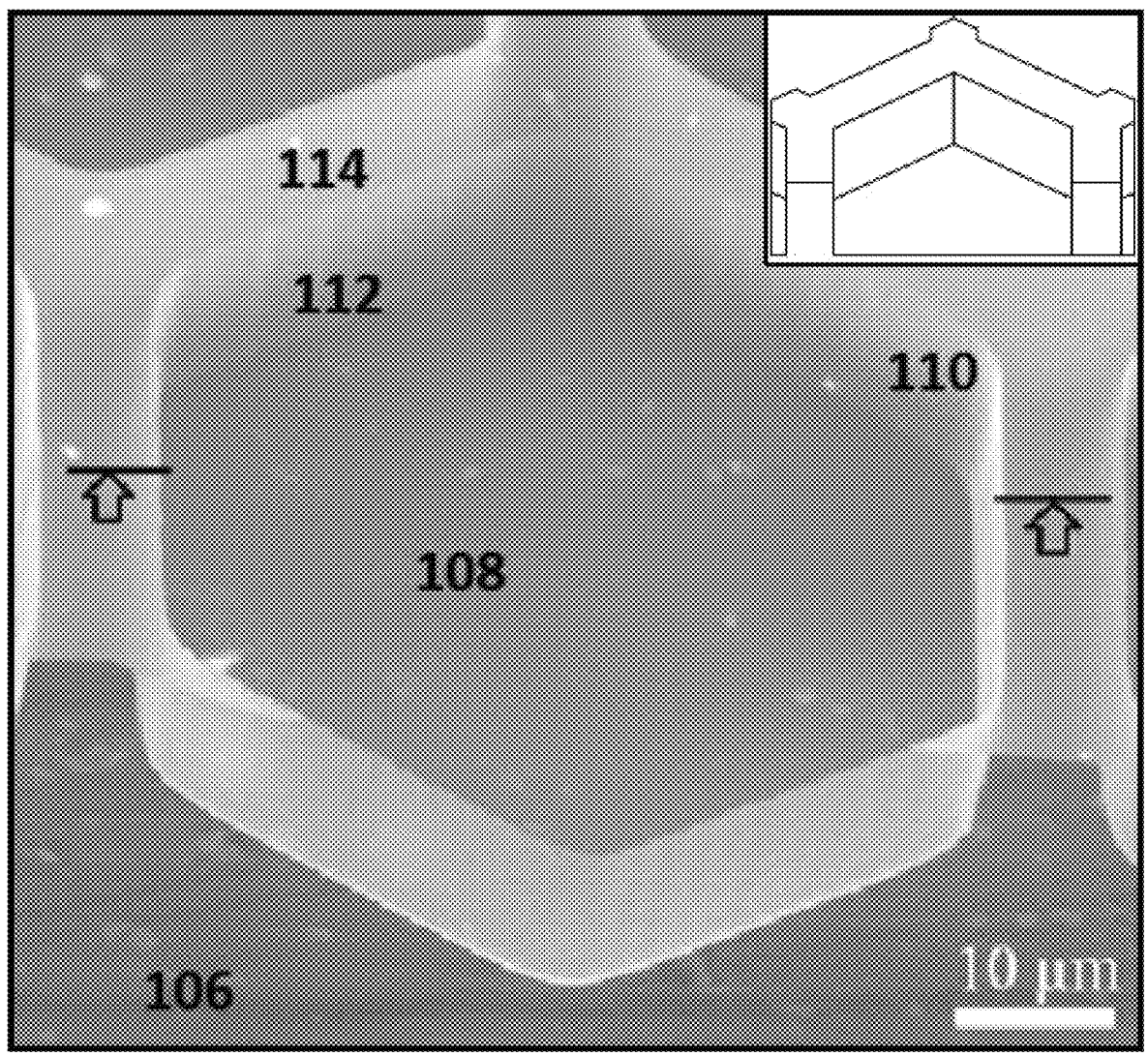
FIG. 1C illustrates a plate structure in accordance with one embodiment of the disclosed subject matter.

A plate structure in accordance with one embodiment of the disclosed subject matter is illustrated in FIGS. 1A through 1C.

FIG. 1A shows a plate structure 100 with a honeycomb structure. FIG. 1B shows a close-up of a portion of the plate structure 100 shown in FIG. 1A. The term "plate structure," as used herein, refers to a continuous structure (as opposed to, for example, a lattice). However, the term "plate structure" does not require that the structure be flat over its entirety. To the contrary, as shown in FIG. 1A, the plate structure 100 includes out-of-plane elements.

With reference to FIG. 1B, the plate structure 100 includes a plurality of base plates 102. The base plates 102 can generally be characterized as residing in a single plane when the plate structure is disposed on a flat surface. However, plate structures in accordance with the disclosed subject matter can be flexible and may be disposed on curved surfaces or the like, as will be discussed in greater detail herein. Therefore, the base plates will be considered to reside in the same plane if they are in a single plane when the plate structure is disposed on a flat surface.

Figure 2:
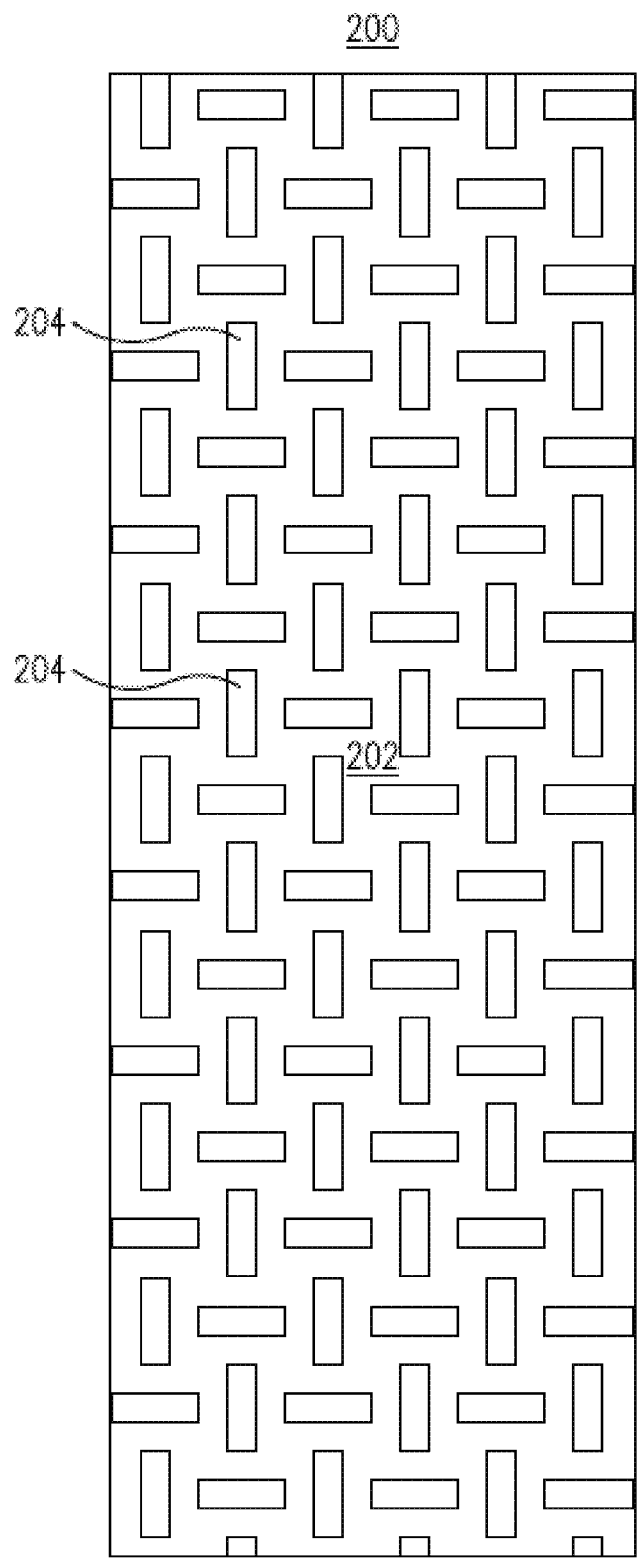
FIG. 2 illustrates an exemplary embodiment of a plate structure having a basketweave pattern in accordance with the disclosed subject matter.

The plate structure 100 further includes one or more strengthening ribs such as strengthening rib 104. In the plate structure 100 shown in FIG. 1B, the strengthening rib 104 form a honeycomb pattern. However, those skilled in the art will understand that the disclosed subject matter is not limited to the honeycomb structure. For example, in accordance with other embodiments of the disclosed subject matter, the strengthening rib can form a basketweave pattern. An exemplary embodiment of a plate structure having a basketweave pattern is shown in FIG. 2. The plate structure 200 includes a base plate 202 and a plurality of strengthening ribs 204. The strengthening ribs can prevent the plate structure from bending along a straight line. That is, the strengthening ribs can be formed such that there is no straight line path across the plate structure that does not intersect at least one of the one or more base plates and at least one of the one or more strengthening ribs. In embodiments that do not avoid the existence of such straight lines, the bending stiffness of the plate can be reduced. The existence of such straight lines can cause the plate to fold easily along these straight lines.

The plate structure can be a nanostructure. For example, in accordance with embodiments of the disclosed subject matter, the plate structure can have a thickness of between about 1 nm and about 1000 nm, between about 1 nm and about 500 nm, between about 1 nm and about 250 nm, between about 1 nm and about 100 nm, between about 10 nm and about 100 nm, between about 20 nm and about 100 nm, between about 20 nm and about 75 nm, or between about 20 nm and about 50 nm. For example, the plate structure can have a thickness of about 5 nm, about 10 nm, about 15 nm, about 20 nm, about 25 nm, about 30 nm, about 35 nm, about 40 nm, about 45 nm, about 50 nm, about 75 nm, or about 100 nm. The term "about" or "approximately" means within an acceptable error range for the particular value as determined by one of ordinary skill in the art, which will depend in part on how the value is measured or determined, i.e., the limitations of the measurement system. For example, "about" can mean a range of up to 20%, up to 10%, up to 5%, and or up to 1% of a given value.

Plate structures in accordance with the disclosed subject matter can have a wide range of heights. The term "height," as used herein, refers to the distance between the base plate and the top of the strengthening rib. In accordance with embodiments of the disclosed subject matter, the plate structure can have a height of between about 1 µm and about 100 µm, between about 1 µm and about 50 µm, between about 1 µm and about 30 µm, between about 5 µm and about 25 µm, and between about 5 µm and about 15 µm. For example, the plate structure can have a height of about 1 µm, about 5 µm, about 7 µm, about 9 µm, about 10 µm, about 11 µm, about 13 µm, about 15 µm, about 20 µm, about 25 µm, about 30 µm, about 50 µm, or about 100 µm.

Plate structures in accordance with the disclosed subject matter can also have a wide range of lengths and/or widths. The term "lateral dimension," as used herein, will refer to the length and width. In accordance with some embodiments, at least one lateral dimension of the plate structure can be between about 0.1 mm and about 5 mm, between about 0.2 mm and about 4 mm, between about 0.3 mm and about 3 mm, between about 0.4 mm and about 2 mm, or between about 0.5 mm and about 1 mm. For example, at least one lateral dimension can be about 0.25 mm, about 0.5 mm, about 0.75 mm, about 1.0 mm, or about 1.25 mm. In accordance with other embodiments, at least one lateral dimension can be between about 0.1 cm and about 10 cm, between about 0.5 cm and about 5 cm, or between about 1.0 cm and about 5 cm. For example, at least one lateral dimension can be at least about 1 cm, at least about 1.5 cm, at least about 2 cm, at least about 2.5 cm, at least about 3 cm, at least about 3.5 cm, at least about 4 cm, at least about 4.5 cm, or at least about 5 cm. Films with nanoscale thickness usually cannot have such large lateral dimensions because post-fabrication stress gradients can cause such ultrathin films to curl up or fracture. However, plate structures in accordance with the disclosed subject matter can prevent such outcomes and allow nanoscale films with lateral dimensions greater than 1 cm.

In some embodiments, when the plate structures have large lateral dimensions (e.g., greater than 1 cm), the cellular structure of the plate structures can be invisible to the naked eye, and the cellular plate can instead be considered a metamaterial with effective properties determined not only by the properties of solid material that it is composed of, but its properties can be determined and/or affected also by the geometry of its cells. In some embodiments, plate mechanical metamaterials can exhibit novel properties that are not achievable with available solid and/or foam-like materials. For example, plate mechanical metamaterials can have the ability to sustain sharp bending deformations without sustaining damage. In some embodiments, plate mechanical metamaterials can have enhanced bending stiffness while exhibiting greatly reduced tensile stiffness, which cannot be achieved with planar structures regardless of thickness.

In an exemplary embodiment of the disclosed subject matter, the plate structure can have a thickness between about 20 nm and about 75 nm and at least one lateral dimension between about 0.5 cm and about 5 cm. While exemplary dimensions of plate structures are described, persons skilled in the art that these dimensions are provided for purposes of explanation and not limitation.

In accordance with embodiments of the disclosed subject matter, the plate structure can be composed of a plurality of cells. For example, a cell 106 of the plate structure 100 is shown in FIG. 1C. The cell 106 includes a planar base portion 108 and at least one out-of-plane portion 110. The term "planar," as used herein, refers to the characteristic that the base portion 108 resides in the same plane as the base portions of adjacent cells.

The out-of-plane portion 110 of cell 106 includes vertical walls 112 that are perpendicular to the base portion 108 and horizontal walls 114 that are parallel to the base portion 108 but lie in a different plane. However, in accordance with embodiments of the disclosed subject matter, the out-of-plane portion need not be limited to vertical and horizontal walls. For example, the out-of-plane portion can include walls that extend from the base portion at a 45 degree angle.

The out-of-plane portion 110 of cell 106 can be connected to the out-of-plane portions of adjacent cells 114 to form at least one strengthening rib. The strengthening rib can form a number of shapes, including a honeycomb shape as shown in FIGS. 1A through 1C. The cells 106 of plate structure 100 have a common shape. In accordance with other embodiments of the disclosed subject matter, the shape of the cells need not be uniform. For example, the plate structure can include a first plurality of cells having a first shape and a second plurality of cells having a second shape. The first plurality of cells and the second plurality of cells can form an interconnecting pattern.

The plate structure 100 can be constructed from a variety of materials. For example, in accordance with an exemplary embodiment of the disclosed subject matter, the plate structure 100 can be fabricated using a refractory metal such as tungsten. In accordance with other embodiments, the plate structure can be made of a ceramic material such as silica ($SiO_2$), alumina ($Al_2O_3$), hafnia ($HfO_2$), titanium nitride ($TiN_x$), and titanium carbide (TiC). The plate structure material can also be, for example, a metal such as platinum or tungsten.

Figure 3:
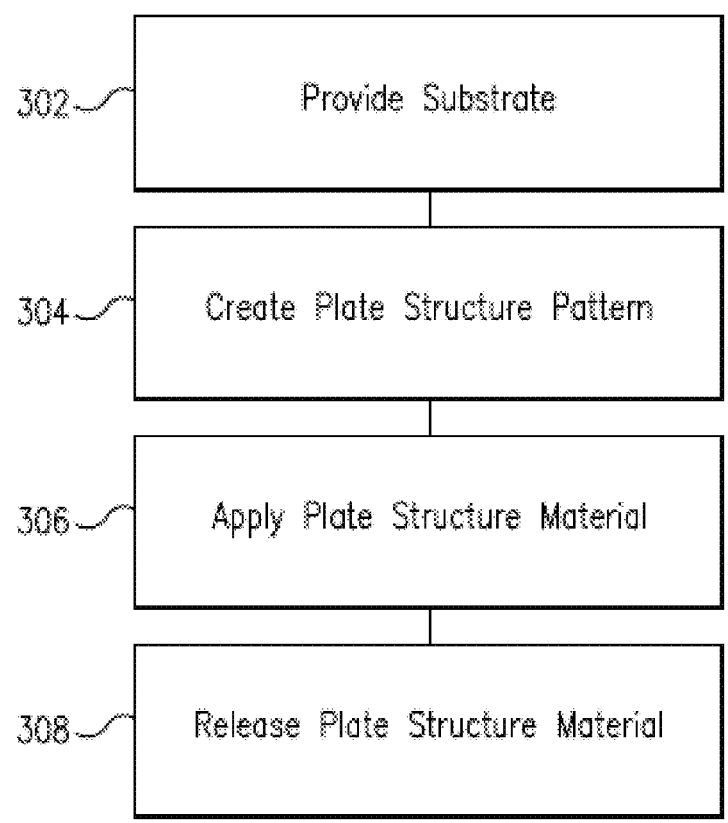
FIG. 3 illustrates an exemplary embodiment of a fabrication process for plate structures in accordance with the disclosed subject matter.

An exemplary embodiment of a fabrication process for plate structures in accordance with the disclosed subject matter is illustrated in FIG. 3. A substrate can be provided (at 302). The substrate can be, for example, a silicon wafer. Other substrates, such as glass or plastic substrates, can also be used.

A plate structure pattern can be created in the substrate (at 304). The plate structure pattern can include a plurality of depressions formed in the surface of the substrate.

The plate structure material can then be applied to the plate structure pattern (at 306). The plate structure can be applied using a gas-based deposition method or a liquid-based deposition method. For example, the plate structure material can be applied using atomic layer deposition. The plate structure material can be, for example, hafnia or alumina. In accordance with other embodiments of the disclosed subject matter, other methods having high conformality, such as chemical vapor deposition or self-limited electroless plating, can be used.

The plate structure can then be released from the substrate (at 308). For example, the plate structure can be released from the substrate using an etching process. The plate structure, when released from the substrate, includes a plurality of base plates and a plurality of rib plates forming at least one strengthening rib, with adjacent base plates being connected by the at least one strengthening rib.

Figure 4:
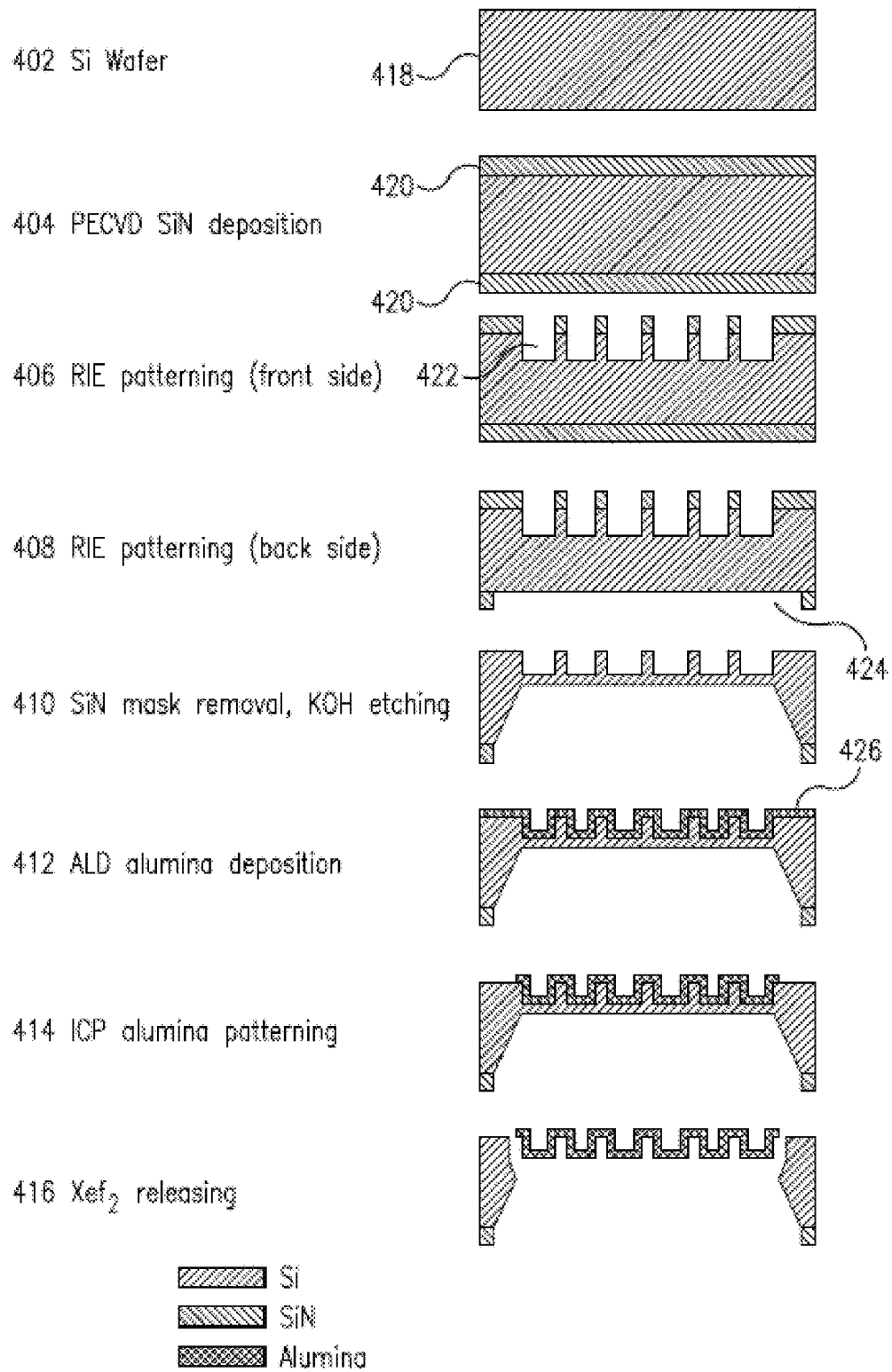
FIG. 4 illustrates an exemplary embodiment of a fabrication process for plate structures in accordance with the disclosed subject matter.

A detailed description of an exemplary embodiment of a fabrication process for plate structures in accordance with the disclosed subject matter is illustrated in FIG. 4. First, a substrate 418 is provided (at 402). The substrate 418 can be, for example, a silicon wafer. The substrate 418 can be polished on both sides.

The substrate 418 can then be coated with a thin film 420 (at 404). The thin film 420 can be, for example, a silicon nitride film. The thin film can be deposited on both sides of the substrate 418 using plasma-enhanced chemical vapor deposition (PECVD).

A plate structure pattern 422 can then be created in a top part of the substrate 418 (at 406). The pattern 422 can be, for example, a honeycomb pattern. The pattern can be created using, for example, electron-beam lithography and/or photolithography and/or nanoimprint lithography and reactive ion etching (RIE).

A second pattern 424 can then be created in the bottom part of the substrate 418 (at 408). The second pattern can be created using photolithography and reactive ion etching. The etching can remove the entirety of the thin film below the plate structure pattern. In accordance with other embodiments of the disclosed subject matter, the second pattern can be created at a different point in the fabrication process.

The thin film 420 can be removed before the plate structure material is applied (at 410). The bottom part of the substrate can be etched to leave only a thin layer of the substrate below the plate structure material, to make it easier to remove the plate structure material from the substrate later in the process. The etching can be performed using a KOH etching and/or using a laser micromachining process. In accordance with other embodiments of the disclosed subject matter, the etching can be performed at a different point in the fabrication process.

The plate structure material 426 can then be applied to the plate structure pattern (at 412). The plate structure can be, for example, hafnia or alumina. In accordance with one embodiment of the disclosed subject matter, an atomic layer deposition process can be used to apply the plate structure material. For example, trimethylaluminum (TMA) and water can be used as precursors for alumina deposition, while Tetrakis (dimethylamido) hafnium(IV) (TDMAHf) and water can be used as precursors for hafnia deposition.

The plate structure material can then be patterned (at 414) to define the lateral dimensions of the plate. A layer of photoresist can be spin-coated on the plate structure. The substrate can then be soft baked and cooled (slowly to avoid cracking the photoresist). Etching can then be performed to pattern the plate structure material. The etching process can be, for example, inductively coupled plasma etching (ICP) or reactive ion etching.

The plate structure can then be released from the substrate at 416. An etching process can be used for the final release. For example, a fluorine-based isotropic dry etching method such as $XeF_2$ etching can be used to release the plate structure material from the wafer. In accordance with some embodiments of the disclosed subject matter, e.g., where the bottom part of the substrate was not previously etched, a second etching process can precede the final etching process. For example, an anisotropic KOH etching process can be used.

Figure 12:
FIG. 12 depicts a patterned Kapton substrate having deposited thereon an ALD thin film in accordance with the disclosed subject matter.
Figure 13:
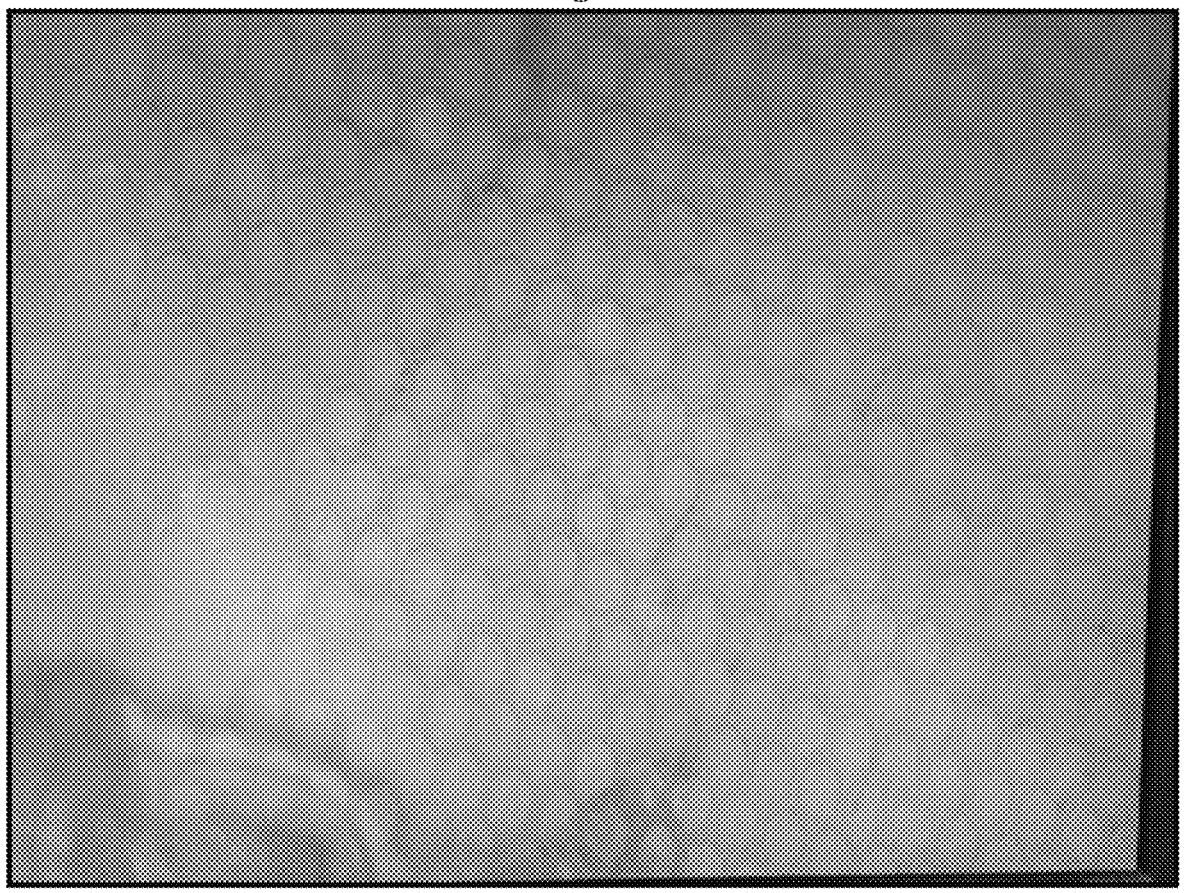
FIG. 13 depicts a suspended ALD film after liquid-based etching and release from a Kapton substrate in accordance with the disclosed subject matter.

In connection with another exemplary embodiment, the substrate can be a plastic substrate and a wet etching process can be used to release the plate structure from the substrate. For example, and not limitation, the substrate can be formed from a polyimide film, such as Kapton. The use of a plastic substrate can allow for the use of liquid-based etching techniques to release the plate structure material. One of skill in the art will appreciate that a variety of wet etching techniques can be used according to the composition of the substrate. FIG. 12 depicts a patterned Kapton substrate having deposited thereon an ALD thin film in accordance with the disclosed subject matter. FIG. 13 depicts a suspended hafnium oxide ALD film after liquid-based etching and release from a Kapton substrate in accordance with the disclosed subject matter.

Plate structure materials in accordance with the disclosed subject matter can exhibit certain properties. For example, plate structures in accordance with the disclosed subject matter can have higher flexural stiffness as compared to planar films. For example, plate structures having the same thickness as planar structures have a much higher spring constant when used as cantilevers and/or doubly clamped beams. Similarly, plate structures having the same spring constant as planar structures can be significantly thinner. For example, with reference to FIG. 5, a first cantilever 502 and a second cantilever 504 are shown. The second cantilever 504 is a planar structure with a thickness of 1 µm. The first cantilever is a plate structure in accordance with an embodiment of the disclosed subject matter having a honeycomb pattern and a thickness of 50 nm. The first cantilever 502 has a spring constant of 0.036 N/m and the second cantilever 404 has a spring constant of 0.032 N/m. Thus, the first cantilever 502 has a similar spring constant but is 20 times thinner than the second cantilever 504. Plate structures in accordance with the disclosed subject matter can be at least about 20 times thinner, at least about 15 times thinner, at least about 10 times thinner, or at least about 5 times thinner than planar structures having the same flexural stiffness.

Plate structures in accordance with embodiments of the disclosed subject matter can be ultralight. For example, the plate structures can have a relative density on the order of about $10^4$. The plate structures can also have an areal density on the order of 100 milligram per square meter. For example, the plate structures can have an areal density between about 100 mg/m$^2$ and about 1000 mg/m$^2$, or between about 10 mg/m$^2$ and about 100 mg/m$^2$.

Figure 6:
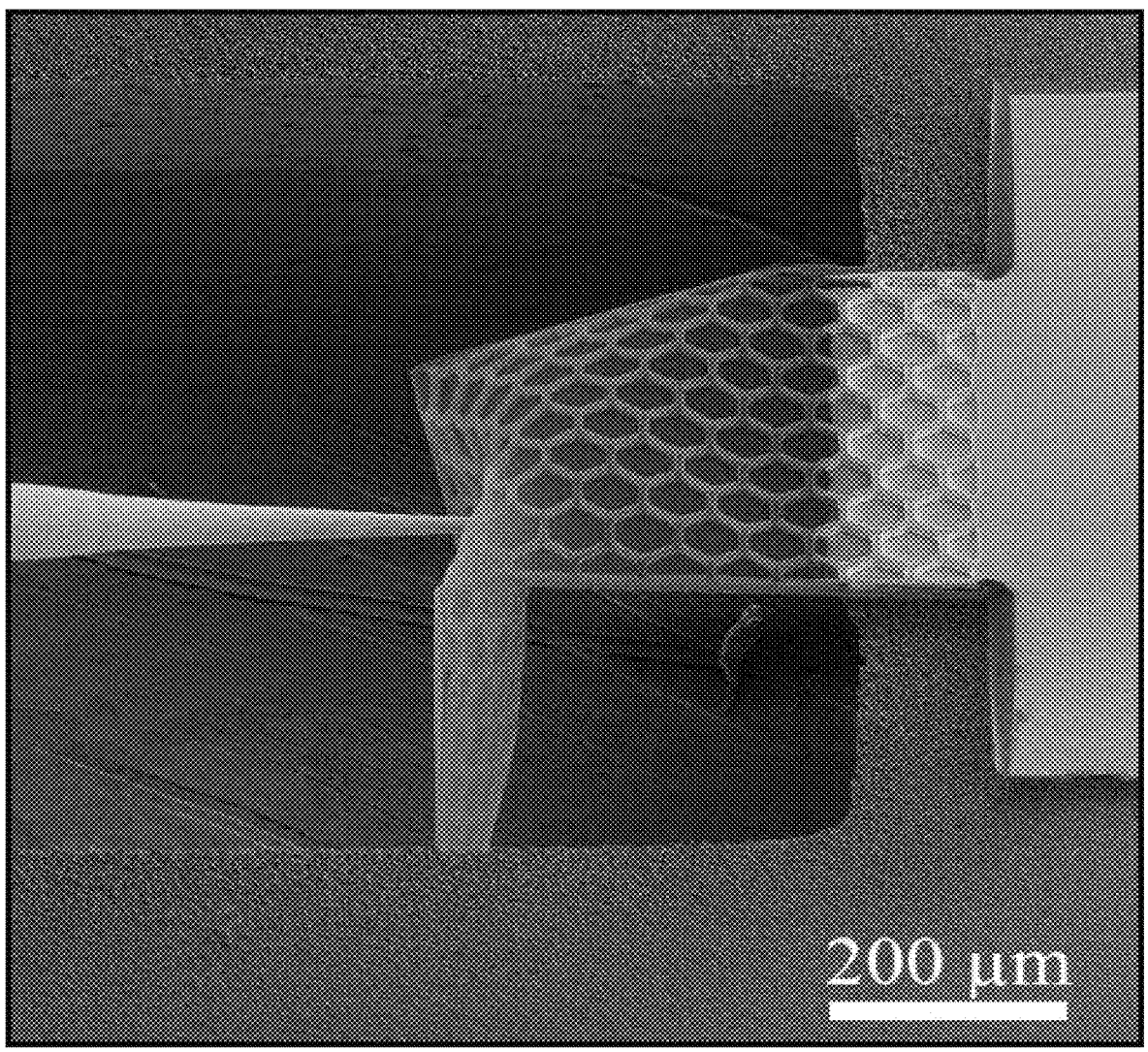
FIG. 6 depicts a plate structure in accordance with certain embodiments of the disclosed subject matter bent at an angle of about 90 degrees without breaking.

Plate structures in accordance with embodiments of the disclosed subject matter can also possess shape-recovering properties. In particular, the plate structures can be flexible. For example, as shown in FIG. 6, plate structures in accordance with certain embodiments of the disclosed subject matter can be bent at a 90 degree angle without breaking and will return to their original shape. In accordance with certain embodiments of the disclosed subject matter, the plate structure can be bent at up to a 180 degree angle without breaking and will return to its original shape. Without wishing to be bound by any particular theory of operation, it is believed that the shape recovery property is not a result of a transition in the phase of the material (as in shape memory alloys) or achieved by folding and unfolding (like origami structures), but rather is attributed to the design of the plate structure.

Plate structures in accordance with the disclosed subject matter can be used in a wide variety of applications. For example, in accordance with certain embodiments, the plate structures can be used in microelectromechanical systems (MEMS). For example, the plate structure can be used in cantilevers.

In accordance with another embodiment of the disclosed subject matter, a plate structure can be used in aviation applications. For example, the plate structure can be applied to the exterior surface of an aircraft or a spacecraft.

The plate structures can also be used in microrobotics, for example, to make wings of flying microbots, or as a rigid ultra-thin scaffold to contain other materials in high-sensitivity measurements.

Figure 14:
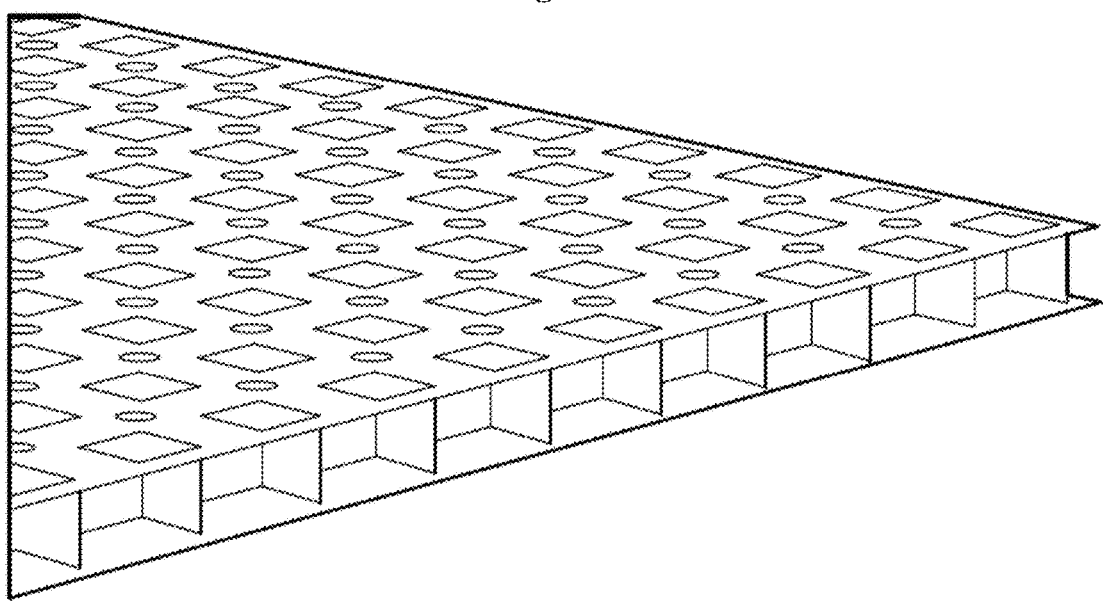
FIG. 14 is a schematic diagram illustrating an insulating two-layer ALD plate in accordance with the disclosed subject matter.

In connection with another aspect of the disclosed subject matter, two or more structures as disclosed herein can be stacked to form a composite material. For example, in accordance with one embodiment of the disclosed subject matter, two honeycomb structures can be fabricated as described herein above, as illustrated by FIG. 14. After fabrication, the structures can be manually stacked to form a metamaterial. Alternatively, two or more structures can be fabricated in a pre-stacked arrangement. For example, the fabrication process can include additional deposition, masking, and etching steps so as to form two or more layers of ALD, which when released can be in a desired stacked configuration.

The structures can be stacked in a variety of configurations to achieve desired properties. For example, and not limitation, two structures can be stacked such that the ridges of honeycomb cells are aligned to create a plurality of voids enclosed by the ultrathin ALD film on all sides. In this manner, a composite structure having insulating properties can be achieved. Additionally or alternatively, two or more structures can be stacked with an adhesive to form a bulk material. For example, an organic polymer layer can be disposed between two ALD structures to increase the strength and toughness of the resulting composite material. The polymer layer can have a thickness approximately equal to that of the ALD structures. Additionally and/or alternatively, graphene flakes can also be used to adhere the ALD structures. Additionally and/or alternatively, the natural adhesion/stiction that occurs between two contacting ALD layers, for example due to van der Waals forces and/or surface tension-induced forces, can be used to adhere the ALD structures.

As noted above, composite materials formed as described herein can have certain properties. For example, and not limitation, such composite materials can have properties that allow for propulsion and/or levitation via radiometric force. For purpose of illustration, and not limitation, the radiometric force, also known as the Knudsen force, can be produced by imposing a temperature gradient across an insulating material. The theoretical foundations of the Knudsen force are known to those skilled in the art. For example, A. E. Woodruff "The radiometer and how it does not work." The Physics Teacher 6.7 (1968): 358-363 and A. Ketsdever, N. Gimelshein, S. Gimelshein, N. Selden, "Radiometric phenomena: From the 19th to the 21st century", Vacuum 86, 1644-1662 (2012), which are incorporated by reference herein in their entirety, provides an overview of this radiometric force. Generally, radiometric force is produced as a result of two contributing factors (1) edge force/normal component of radiometric force and (2) Shear type "transpirational" component produced by transition flow characteristics of the gas that surrounds the radiometer. In some embodiments, both components of the radiometric force can require a presence of a temperature gradient in the gas and/or the structure on which the Knudsen force acts.

A number of proposals have suggested using the Knudsen force for propulsion and/or levitation. However, the maximum demonstrated force using conventional techniques is approximately 0.1 N/m$^2$, which is theoretically sufficient to levitate structures less than about 3 microns thick. However, it is impossible to sustain a sufficient temperature difference for solid films of such thickness in midair.

In accordance with an exemplary embodiment, a composite structure comprising two stacked structures in accordance with the disclosed subject matter, e.g., as illustrated in FIG. 14, can have insulating properties and a weight which can be levitated using Knudsen forces even at atmospheric pressure. In certain embodiments, the effective edge area or active area of the composite structure can be increase by punching holes in the composite structure. In this manner, a multi-radiometer configuration is achieved that has several air flow paths, increasing the overall force produced.

EXAMPLE 1

Figure 7A:
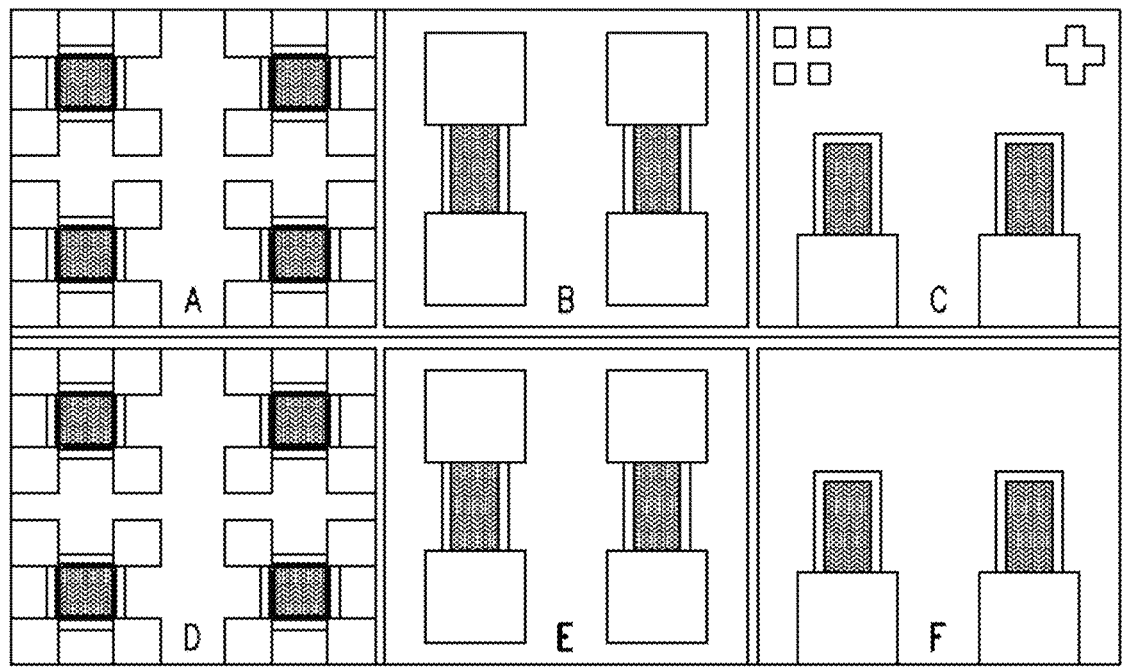
FIG. 7A illustrates different geometries and clamping configurations of honeycomb structures fabricated in accordance with the disclosed subject matter.
Figure 7B:
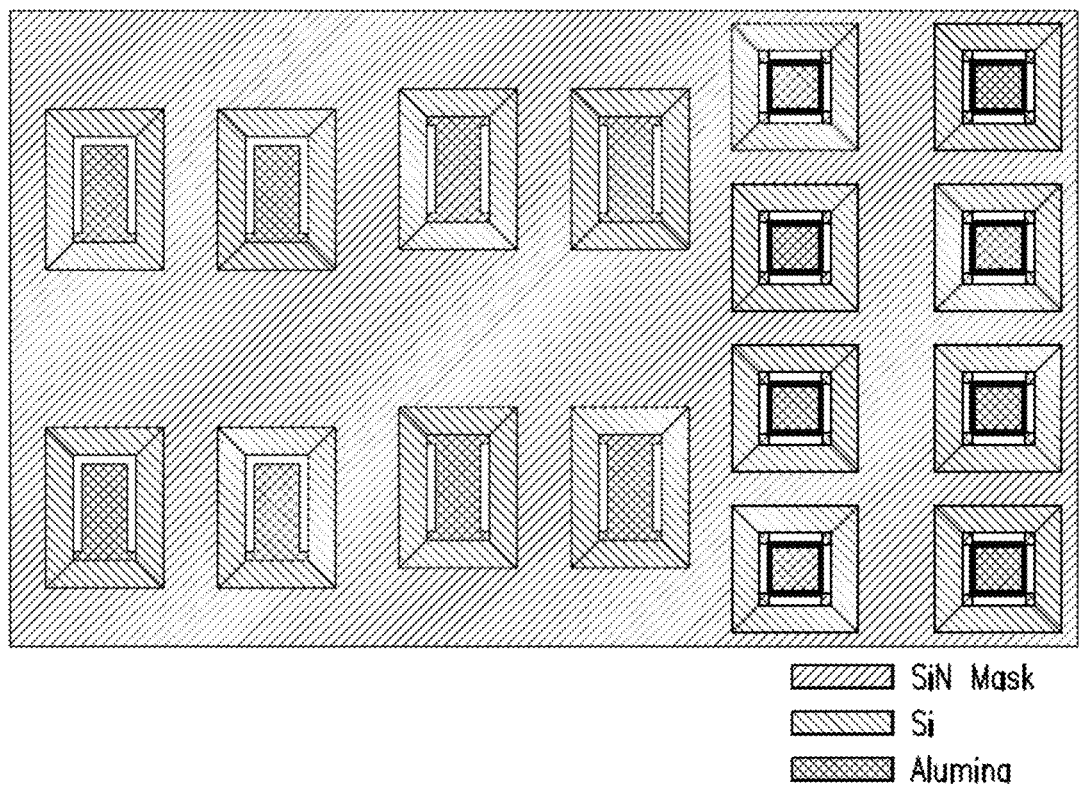
FIG. 7B illustrates different geometries and clamping configurations of honeycomb structures fabricated in accordance with the disclosed subject matter.

Honeycomb structures were designed and fabricated out of 53 nm-thick ALD alumina ($Al_2O_3$) and silica ($SiO_2$). The honeycomb structures were fabricated in different geometries with lateral dimensions varying between 0.5 and 10 millimeters. Three clamping configurations have been used: cantilevers, doubly clamped beams, and rectangular plates clamped on all four sides, as shown in FIGS. 7A and 7B.

The fabrication started with a double side polished Si wafer. SiN films with a thickness of 180 nm were deposited on both sides using PECVD. Honeycomb structures with a height of 10 µm were patterned in silicon using photolithography and reactive ion etching (RIE). The back side was patterned via photolithography and the openings were obtained by RIE etching of SiN. The SiN mask was removed from the front side and the ALD layer was then deposited. For alumina deposition, trimethylaluminum (TMA) and water were used as precursors and two different temperatures, 150° C. and 250° C., were used. The deposition rates were measured using an ellipsometer to be 0.91 Å/cycle at 150° C. and 1.18 Å/cycle at 250° C.

In order to pattern the ALD layer, a thick layer of SPR 220 resist was spin-coated on the structure. The thickness of the resist was measured to be 14 µm. After the spin coating and soft baking at 105° C. the wafer was cooled down slowly to make sure the photoresist did not crack. After photolithography, inductively coupled plasma etching (ICP) with a BCl3-based chemistry process was used to pattern the alumina ALD layer. In contrast, RIE was used to pattern the silica ALD layer. Anisotropic KOH etching was next. Before placing the wafer in KOH, the top surface was covered with ProTek to prevent the ALD layer from being etched in the KOH solution. Silicon etching rate of 75 µm/hour was measured at 80° C. in the 30% KOH solution. By accurately timing the KOH etching process, it was possible to stop the process ~20 µm from the top surface. The exact depth was measured using a Zygo profilometer. After that, the ProTek layer was removed and oxygen plasma was performed to make sure the surface of the wafer was completely clean and without any polymer residue. In some embodiments, as an alternative to KOH etching, the silicon substrate can be partially removed using a laser micromachining system such as IPG Photonics IX-280-DSF. $XeF_2$ etching was used for the final release of the structure. Approximately 100 cycles (30 sec each) of $XeF_2$ etching with a ratio of 3.2:2 ($XeF_2$:$N_2$) was required for the complete release of the structures.

Figure 5A:
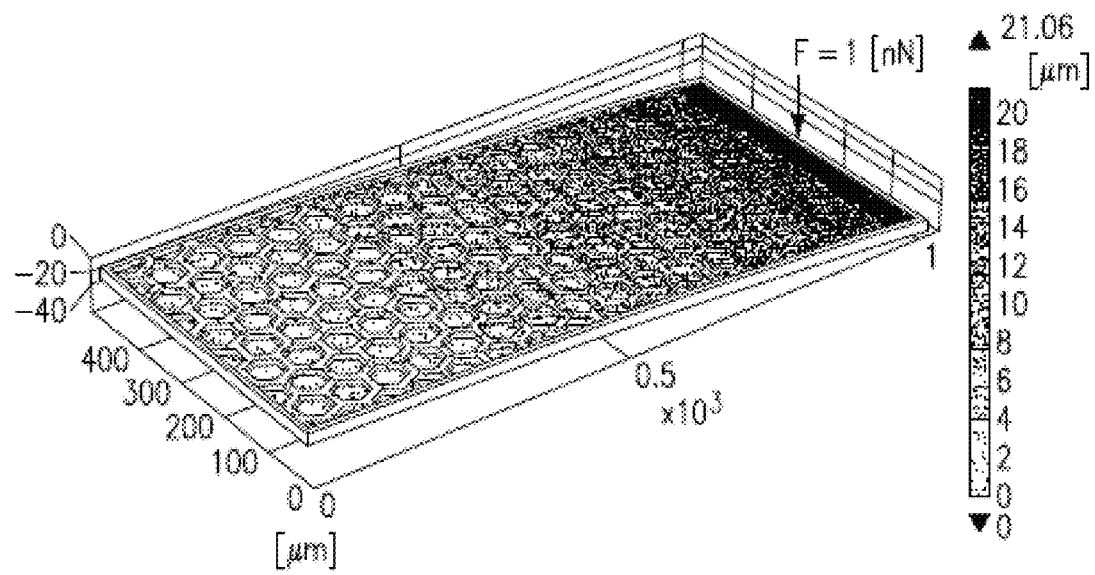
FIG. 5A illustrates certain properties of plate structure materials in accordance with the disclosed subject matter.
Figure 5B:
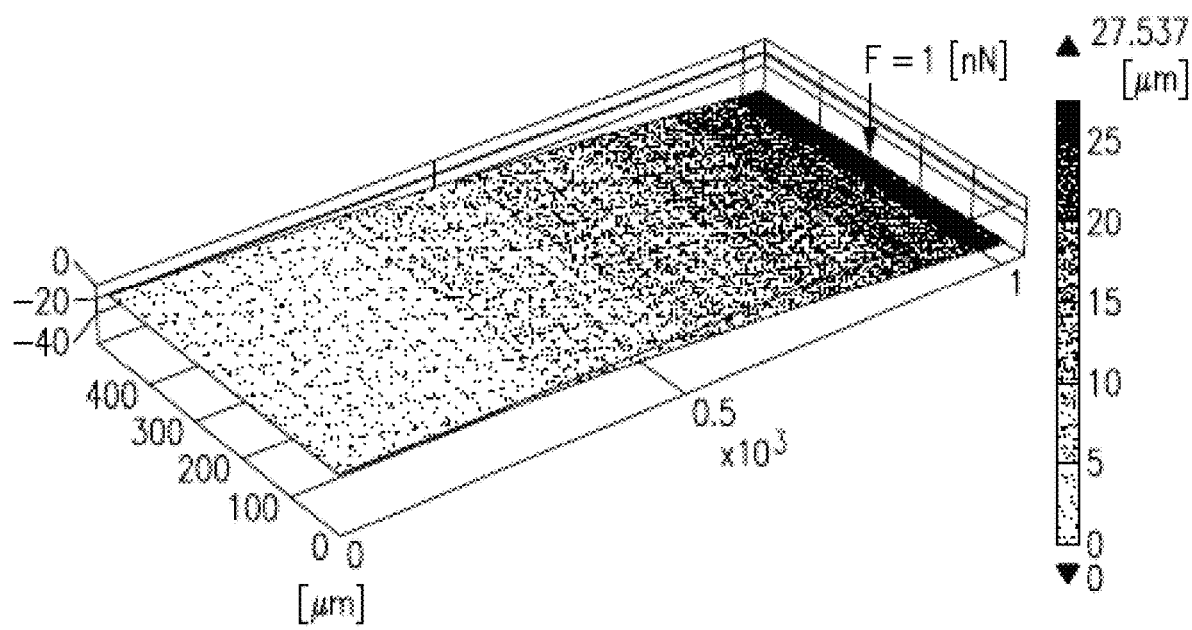
FIG. 5B illustrates certain properties a reference material.

AFM measurements of force-displacement curves as well as finite element simulations of the fabricated honeycomb cantilevers were performed. In both experiments and simulations, one end of the cantilever was fixed and a force was applied on the other end (FIG. 5). For honeycomb cantilevers with ALD film thickness of 100 nm, 50 nm, and 20 nm, the spring constant were predicted to be 0.09 N/m, 0.03 N/m, and 0.01 N/m, respectively, assuming Young's modulus of 200 GPa for the alumina layer.

For comparison, we also performed finite element simulations for planar cantilevers. When using the same film thickness, planar structures were approximately three orders of magnitude more compliant than honeycombs (FIG. 5). In other words, the planar structure needed to be much thicker than the ALD honeycomb to achieve the same spring constant. For example, a 50-nm-thick honeycomb cantilever had a spring constant of 0.036 N/m, similar to the spring constant of 0.032 N/m for a 1-micron-thick planar cantilever.

Figure 8A:
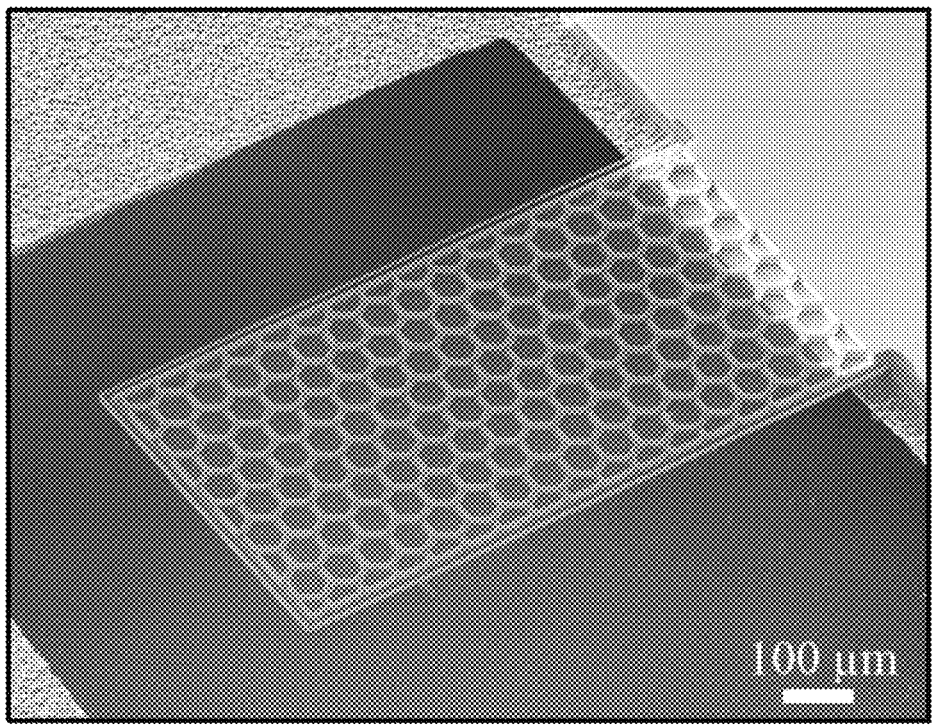
FIG. 8A is a SEM image of a cantilever structure in accordance with the disclosed subject matter under an acceleration voltage of 15.0 kV.
Figure 8B:
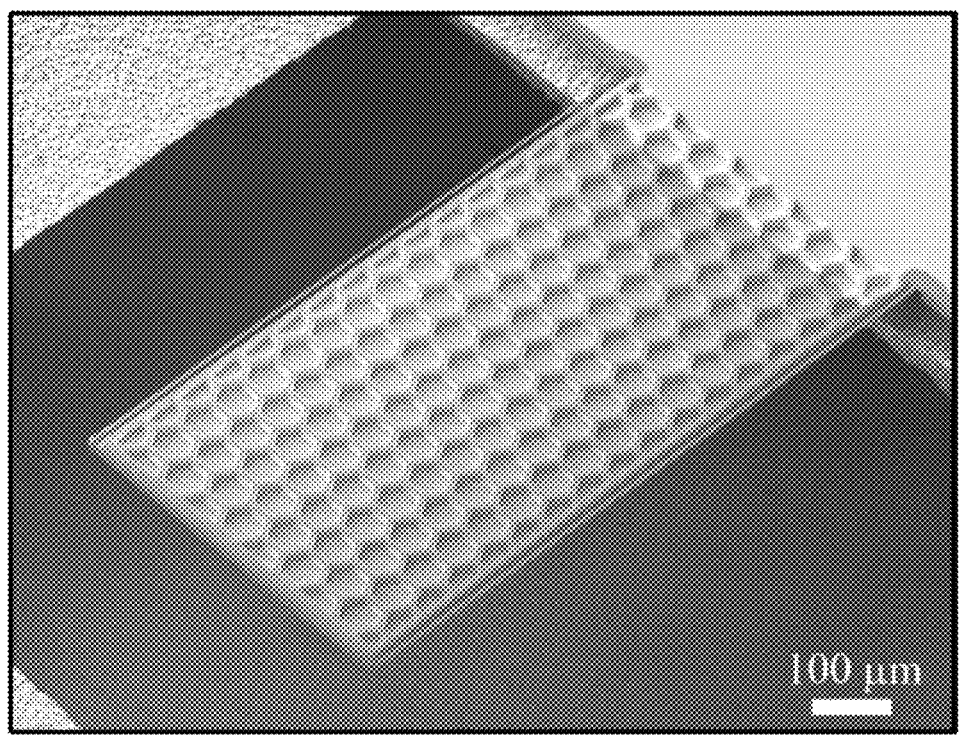
FIG. 8B is a SEM image of a cantilever structure in accordance with the disclosed subject matter under an acceleration voltage of 2 kV.

Under the acceleration voltage of 15.0 kV the structure is almost transparent in the SEM but becomes more opaque when the acceleration voltage in the SEM is reduced to 2 kV. FIG. 8A shows a cantilever and FIG. 8B shows the same one but under an acceleration voltage of 2.0 kV. As shown in FIG. 8A, the released honeycomb lattice structure does not exhibit any noticeable warping despite its large size. The released structure is silicon free.

Figure 8C:
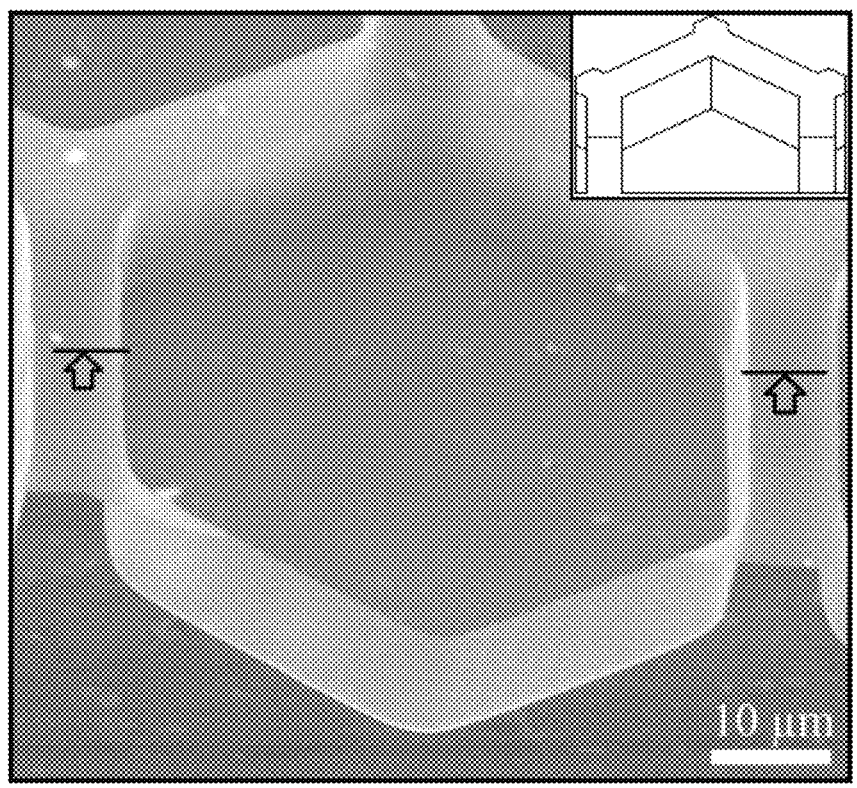
FIG. 8C depicts a broken cell from the cantilever of FIGS. 8A and 8B showing the shell morphology of the constituent element of all three structures.

FIG. 8C depicts a broken cell from the cantilever showing the shell morphology of the constituent element of all three structures. Some very small bright spots are visible in the picture and suspected to be Si particles. Since these particles are not continuous and have a very small quantity, their effects on the mechanical properties of the cantilever are negligible.

In order to study the flexibility and shape recovery property of the structure a micromanipulator inside an FIB microscope was used. Honeycomb cantilevers with different ALD layer thicknesses went under complex loading and deformation. It was observed that the structures were extremely flexible and after each deformation recovered their original shapes. As can be seen in FIG. 5 a cantilever is bending 90 degrees without breaking. It was observed that structures with thinner ALD layer films were able to withstand a higher level of deformation without breaking. Flexibility is an appealing feature in light-weight materials. This property is advantageous particularly in comparison with the polymer-reinforced silica aerogels where the brittleness precludes any large deformation.

The shape recovery seen here is much stronger than what was reported before for modified aerogel materials where they recovered their original length after 60% compression or what was shown for similar hierarchical structure with a shape recovery ability from 50% compression. The shape recovery property here is not a result of a transition in the phase of the material like shape memory alloys (SMAs) or achieved by folding and unfolding like origami structures, but is attributed to a specific design and ultrathin structure that accomplished high robustness as well as shape recovery. This characteristic shows that a brittle material such as alumina film when used in the fabrication of a cellular structure with nanometer thickness behaves completely differently. Cantilevers with a continuous layer of remaining Si having a thickness of more than 100 nm are much less flexible and are incapable of becoming deformed without breaking compared to fully-released (e.g., silicon-free) cantilevers.

Figure 9:
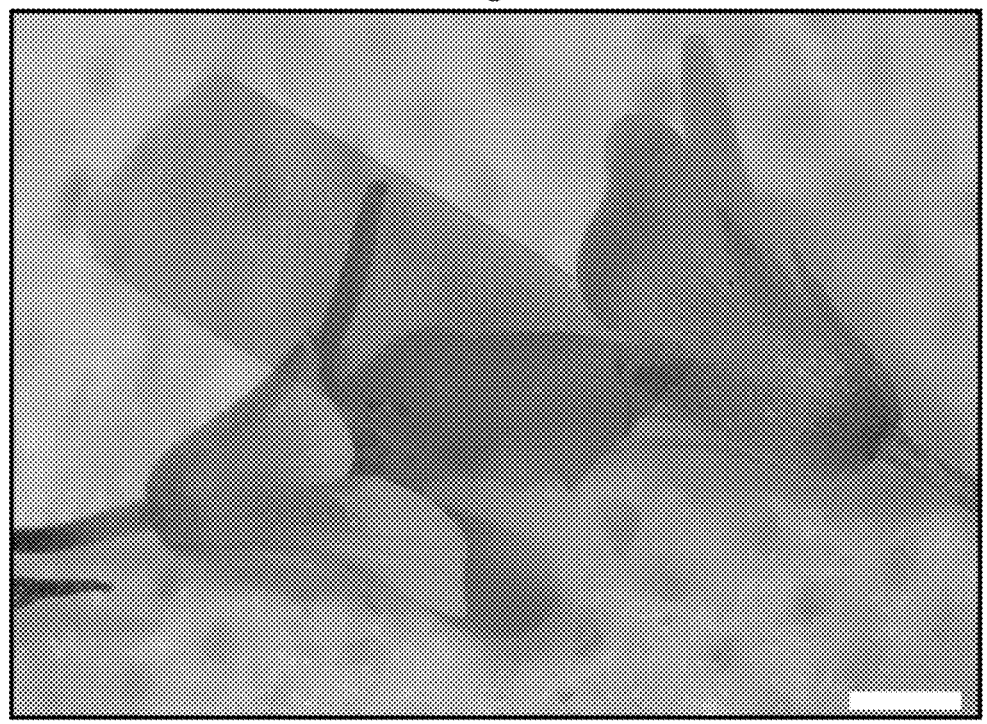
FIG. 9 shows a cantilever separated from its pad and positioned on flower petals without causing any bending in the petals, showing the light weight of the structure

Centimeter-long cantilevers were also fabricated. While the ALD layer thickness was only ~50 nm thick, the devices did not show any warping or deformations. The cantilevers were extremely light and floated in air easily. FIG. 9 shows a cantilever separated from its pad and positioned on flower petals without causing any bending in the petals, showing the light weight of the structure.

Figure 10A:
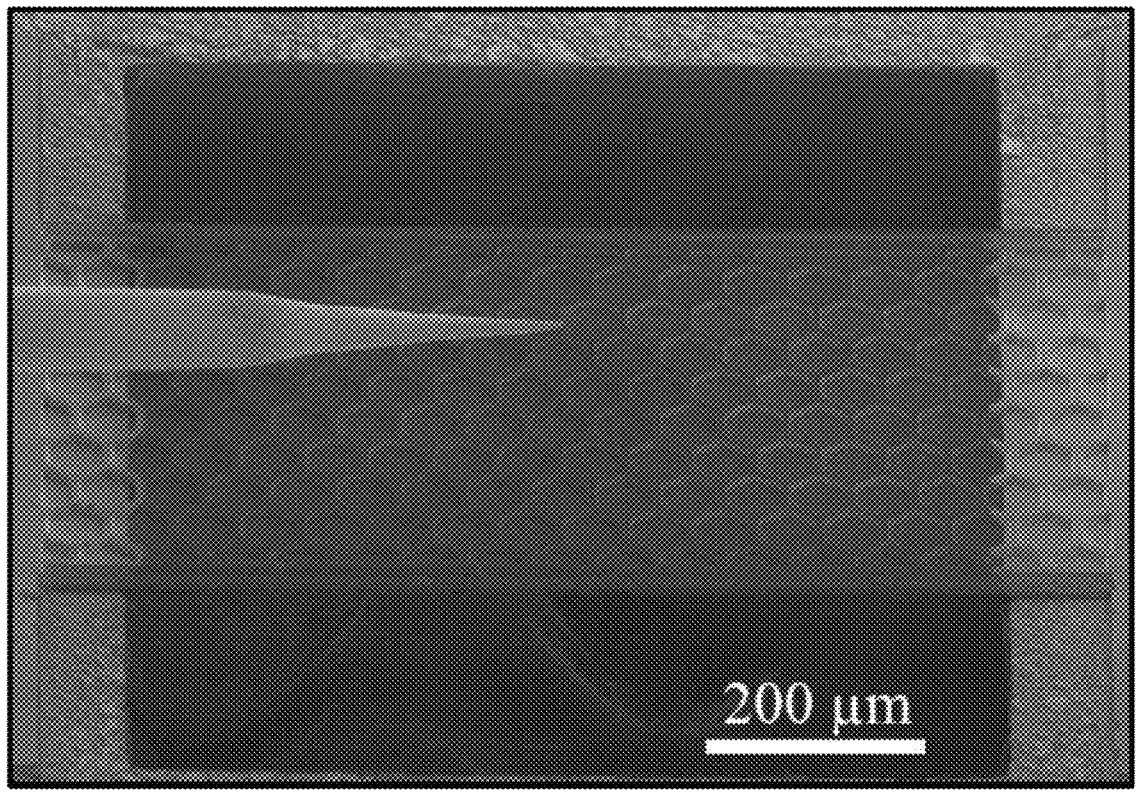
FIG. 10A is a SEM image of a manipulator with a sharp tip over a film in accordance with the disclosed subject matter.
Figure 10B:
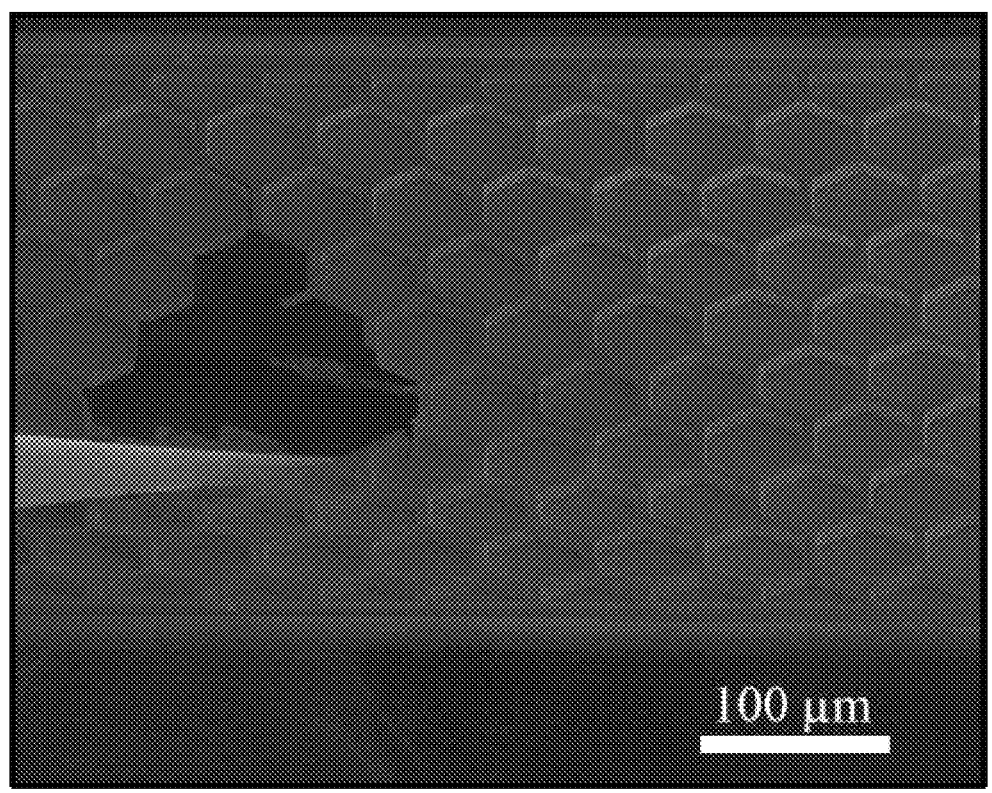
FIG. 10B is a SEM of the manipulator and film of FIG. 10A after the tip of the manipulator has penetrated the film and broken some of the cells.
Figure 10C:
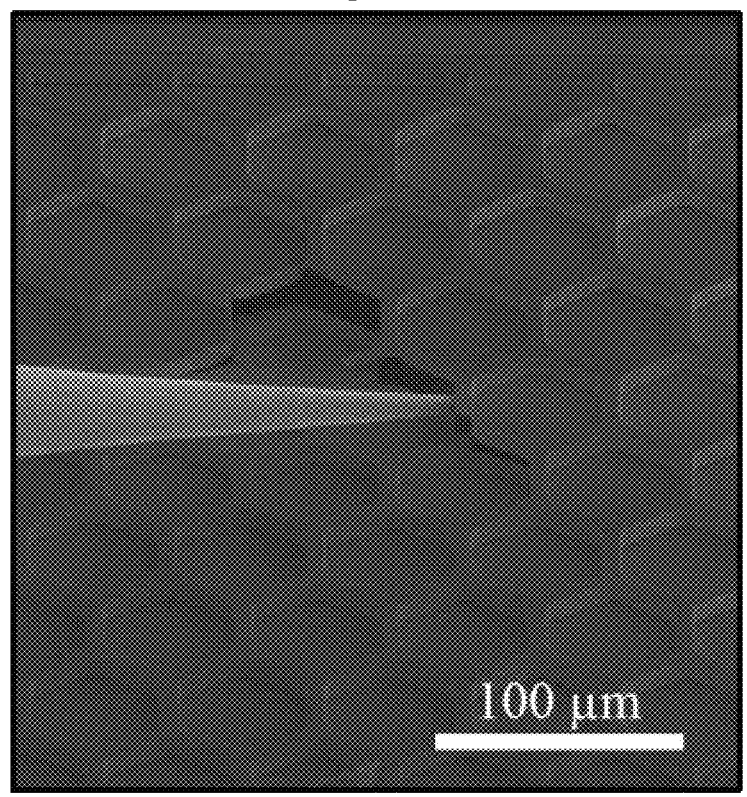
FIG. 10C is a SEM image of the manipulator and film of FIGS. 10A and 10B as the tip of the manipulator is being pulled back.
Figure 10D:
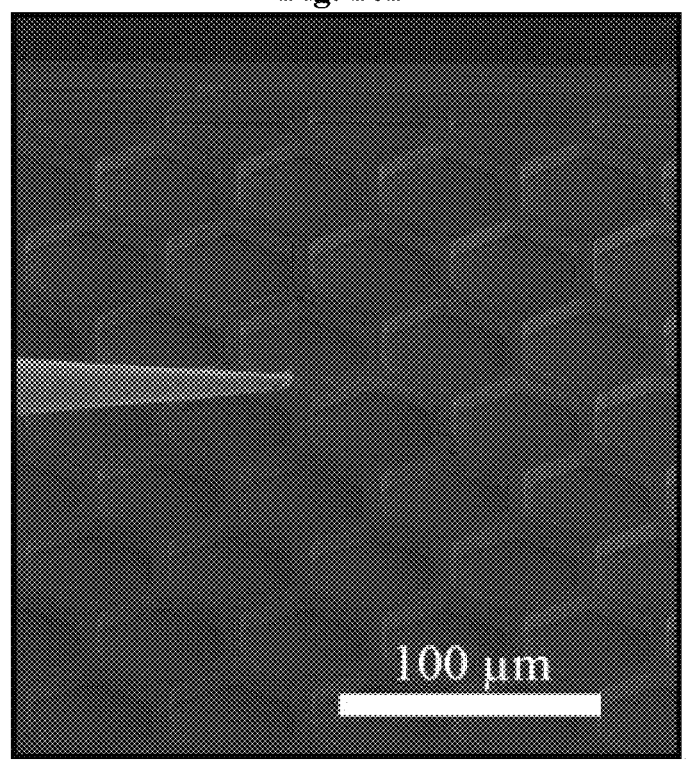
FIG. 10D is a SEM image of the manipulator and film of FIGS. 10A, 10B, and 10C after the manipulator has been pulled back.

Another interesting property of this design is broken area recovery and damage localization. As seen in FIG. 10A through 10D, the sharp tip of the manipulator penetrates the film and breaks some of the cells (FIG. 10A, 10B). Surprisingly, the cells recover their original shape and the hole becomes almost closed as soon as the manipulator is pulled back (FIG. 10C, 10D). In contrast, cracks in completely planar films of nanoscale thickness tend to propagate far from the point where a sharp tip is applied, often resulting in the fracture of the complete structure.

Figure 11A:
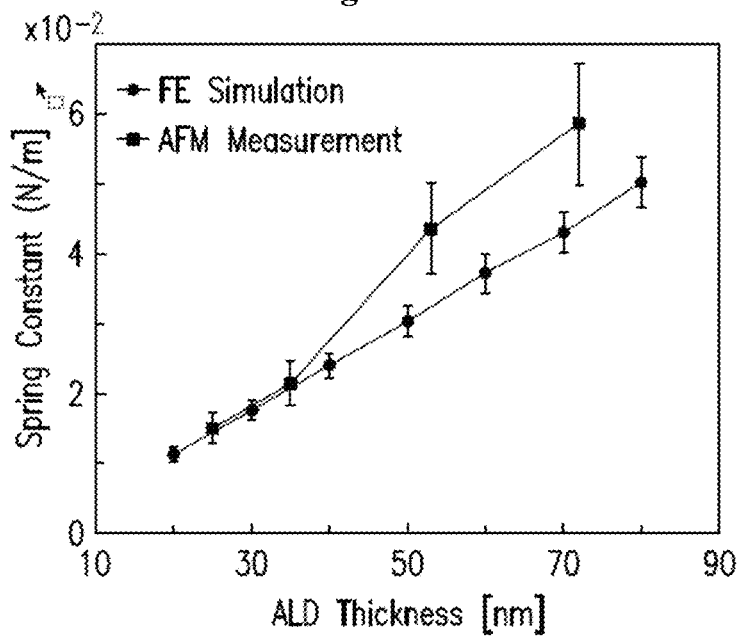
FIG. 11A is a graph comparing the spring constant from a simulation and experimental results for different thicknesses of ALD alumina for honeycomb cantilevers in accordance with the disclosed subject matter.

Mechanical characterization of the cantilever was conducted using an AFM. The mechanical properties of cellular structures are merely dependent on the properties of the material that they are made from, their design, their relative density, and the particular geometry of the cells. The relative density for the structure, in the order of $10^{-3}$, was in the range of what is calculated for a simple honeycomb with similar dimensions. The spring constant of the cantilevers were obtained from the force-displacement results from the AFM measurement. FIG. 11A compares the spring constant from the simulation and experimental results for different thicknesses of the ALD alumina in the range of ~25 to 72 nm for honeycomb cantilevers with a height of 10 μm. Each one of the experimental points is the average of four measurements. As expected, the spring constant of the honeycomb cantilever increases by increasing the ALD layer thickness. Also in this figure the finite element simulation predictions for the spring constant of analogous cantilevers are presented. There is a good agreement between the experimental and simulation results.

Figure 11B:
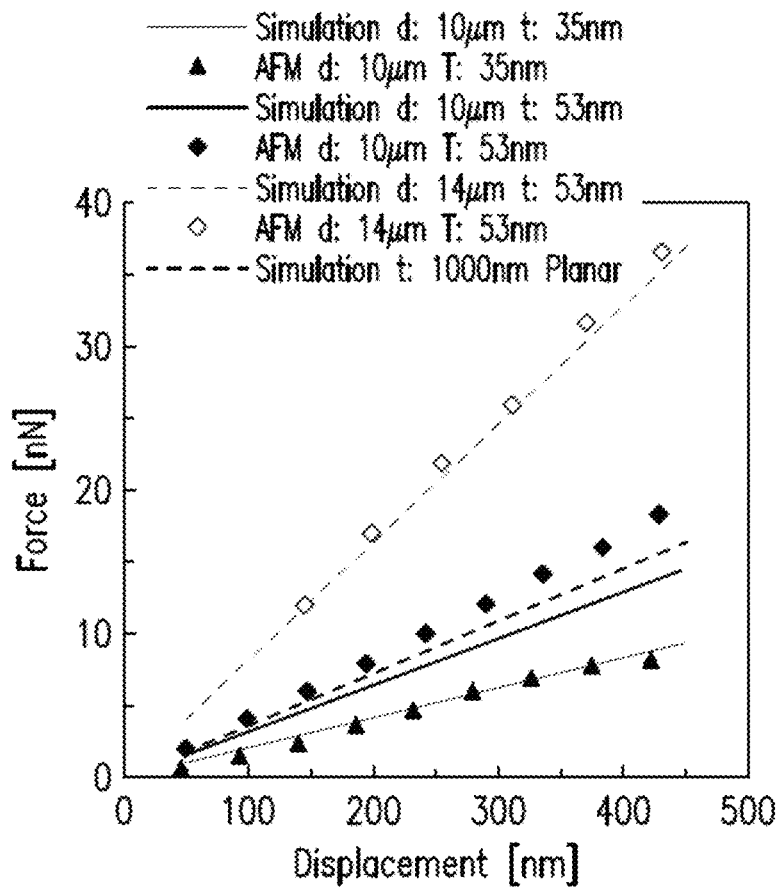
FIG. 11B is a graph comparing force-displacement for simulations for different thicknesses of ALD alumina for honeycomb cantilevers in accordance with the disclosed subject matter.
Figure 11C:
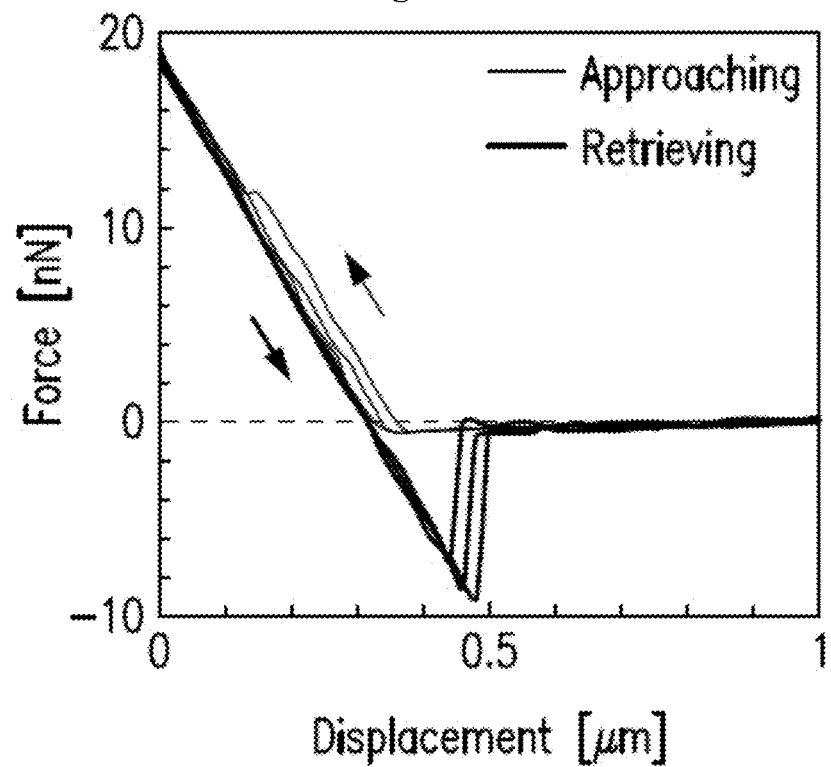
FIG. 11C is a force-displacement graph illustrating cyclic bending tests of honeycomb cantilevers in accordance with the disclosed subject matter.

The experimental results for the force-displacement behavior of different fabricated cantilevers are shown in FIG. 11B together with the predictions of finite element simulations. For comparison, we also performed finite element simulations for planar cantilevers. When using the same film thicknesses, planar structures were approximately three orders of magnitude more compliant than honeycombs. In other words, the planar structure needed to be much thicker than the ALD honeycomb to achieve the same spring constant. To achieve a similar spring constant, planar cantilevers would need to be made from films about 20 times thicker than the 3D honeycomb cantilevers. For example, a 50-nm-thick honeycomb cantilever with a height of 10 μm had a spring constant of 0.031 N/m, similar to the spring constant of 0.032 N/m for a 1-micron-thick planar cantilever. Cyclic bending tests were performed to study the fatigue behavior of the honeycomb cantilevers. A cantilever with a honeycomb height of 10 μm and an ALD layer thickness of 72 nm was bent and unloaded 400 times consecutively. The spring constant of the beam did not change even after that many cycles. Also, the beam was able to recover its initial shape after the bending. We did not observe any defects or sign of failure. FIG. 11C illustrates the force-displacement (F-D) graphs after 1, 200, and 400 cycles. As can be seen here, there is no sudden drop in the applied forces and they are all superimposed with the same slope. This proves that no structural failure happened in the cantilever due to the bending cycles, no plastic deformation happened during the experiment, and the beam maintained its original spring constant.

Figure 15A:
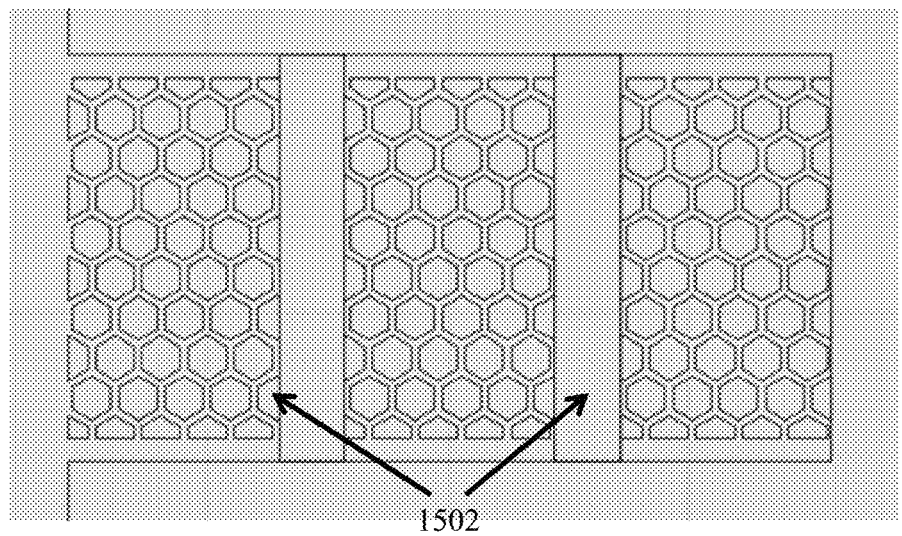
FIG. 15A is a diagram illustrating a folding plate in accordance with the disclosed subject matter.
Figure 15B:
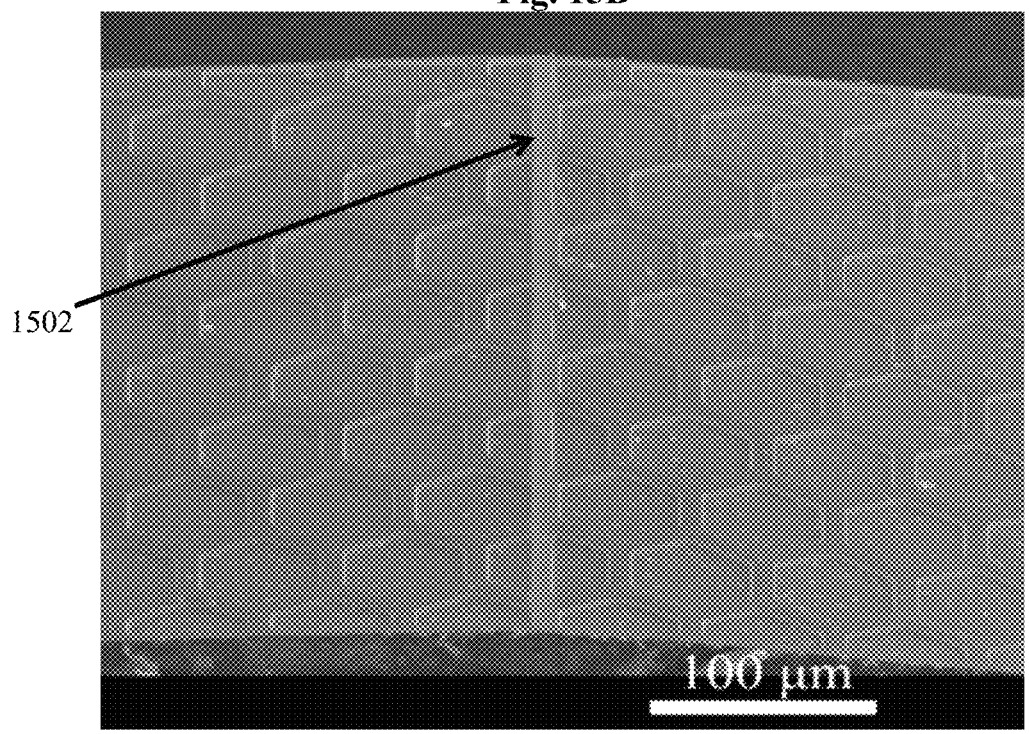
FIG. 15B is a SEM image of the folding plate shown in FIG. 15A in accordance with the disclosed subject matter.

FIG. 15A is a diagram illustrating a folding plate. The disclosed continuous single-layer plate can be a folding plate as shown in FIG. 15A. As shown in FIG. 15A, the folding plate can include a portion including a honeycomb-like structure and a planar portion 1502 (e.g., not patterned with hexagonal honeycomb-like structures). The planar portion can be used to create fold lines in the folding plate to create origami-like foldable structures. In some embodiments, the thickness of the folding plate can remain even throughout the plate. FIG. 15B is a SEM image of the folding plate shown in FIG. 15A.

Figure 16:
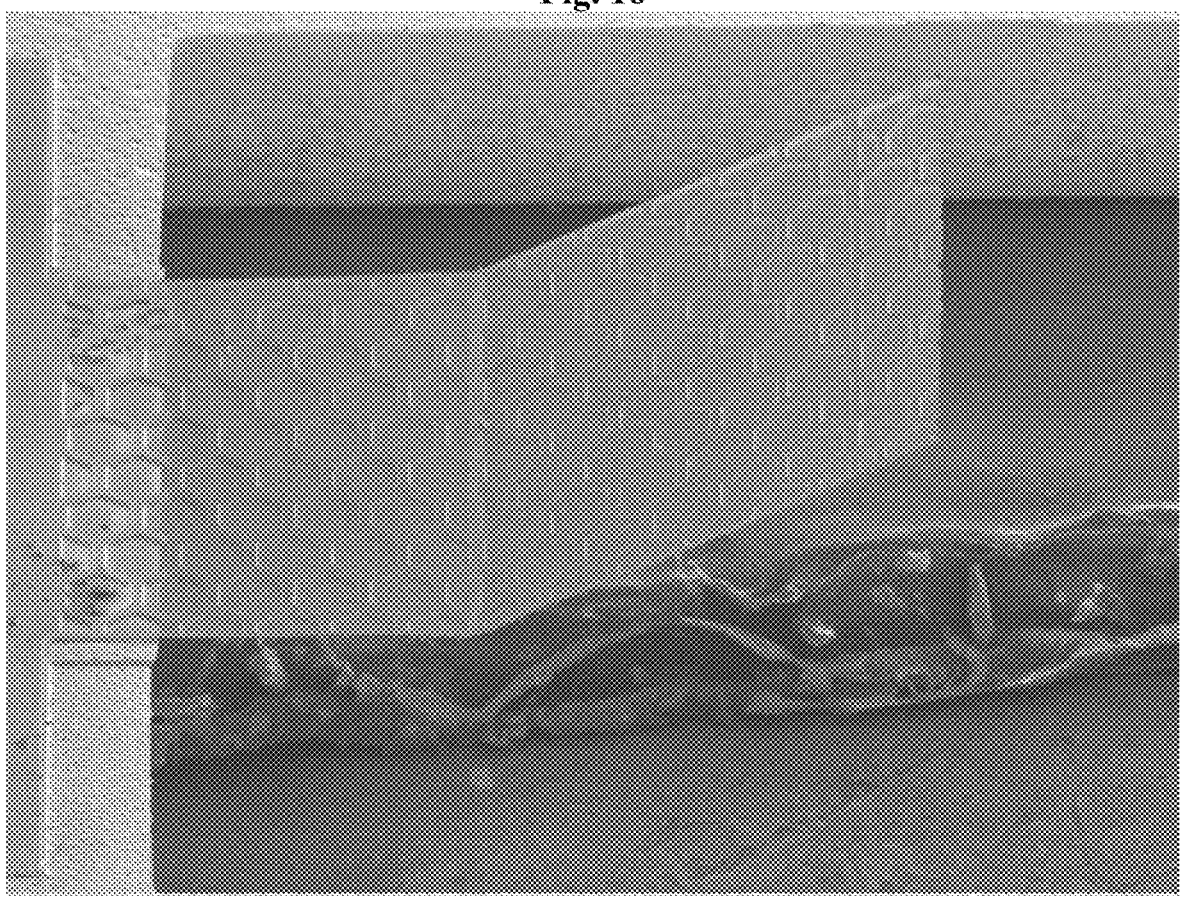
FIG. 16 is a SEM image of a folding plate deforming due to an ion beam in accordance with the disclosed subject matter.

FIG. 16 is a SEM image of a folding plate deforming due to an ion beam. As illustrated by FIG. 16, the folding plate can be subjected to bending deformation using the ion beam to test the resilience and capability of bending along the fold lines formed by the planar areas of the plate.

Multilayer Plate Mechanical Metamaterials

In another aspect of the disclosed subject matter, shape-recovering, flat, ultrathin, continuous plate mechanical metamaterials including at least two separate ultrathin layers are provided. Systems and methods for fabricating and characterizing plates created from two ultrathin ALD layers and capable of withstanding repeated extreme mechanical deformation are provided herein by the disclosed subject matter. The disclosed plates can include two or more ultrathin layers. In some embodiments, the first ultrathin layer can have a flat surface and the second ultrathin layer can have a corrugated surface. In some embodiments, both layers can be corrugated single-layer plates as described above, and the two-layer structure can be formed by stacking two single-layer plates together. The first and second ultrathin layers can be each less than 100 nm thick and can be created using atomic layer deposition, forming a joined structure similar to honeycomb sandwich plates. In some embodiments, the stacking process can also be repeated, for example, by stacking more than two single-layer plates and/or by staking previously created two-layer plates together. The disclosed plates can exhibit a high bending stiffness while still possessing a low area density (e.g., approximately 0.5 g/m$^2$).

Figure 17A:
FIG. 17A is a SEM image of a cantilevered plate made from a two-layer mechanical metamaterial in accordance with the disclosed subject matter.
Figure 17B:
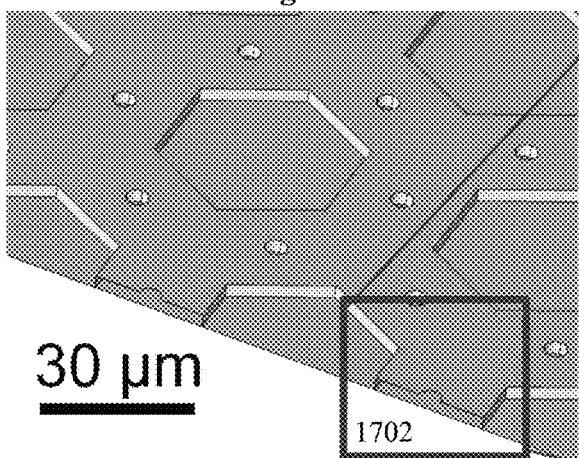
FIG. 17B is a schematic diagram illustrating the periodic geometry of the honeycomb two-layer plate of FIG. 17A in accordance with the disclosed subject matter.

FIG. 17A is a SEM image of a cantilevered plate made from a two-layer mechanical metamaterial. The exemplary cantilevered plate in the embodiment illustrated by FIG. 17A can have a length of 1 mm and a width of 0.5 mm. Since the freestanding ALD layers can be highly transparent in SEM, they are colored for clarity in the embodiment depicted in FIG. 17A. As shown in FIG. 17B, the disclosed two-layer plate can be fully suspended plate metamaterials made from two layers of nanoscale thickness, whose geometry and properties can be similar to honeycomb sandwich plates. In some embodiments, the two layers can be offset from each other but at the same time can be connected using hexagonal vertical walls, which prevent shear of the two layers with respect to one another. As a result, the two-layer plates can offer much higher bending stiffness than the single-layer structures while still possessing extremely low weight and mechanical robustness. The improved bending stiffness can be a result, at least in part, due to the structural similarity of the disclosed two-layer materials to honeycomb sandwich plates. However, in contrast to sandwich composite plates, the disclosed nanoscale two-layer mechanical metamaterials of FIG. 17A can sustain extremely large deformations without fracture, fully recovering their original shape and not displaying internal damage.

FIG. 17B is a schematic diagram illustrating the periodic geometry of the two-layer plate of FIG. 17A. The bottom layer can be planar and continuous while the top layer can be corrugated and can include etch holes for release.

Figure 17C:
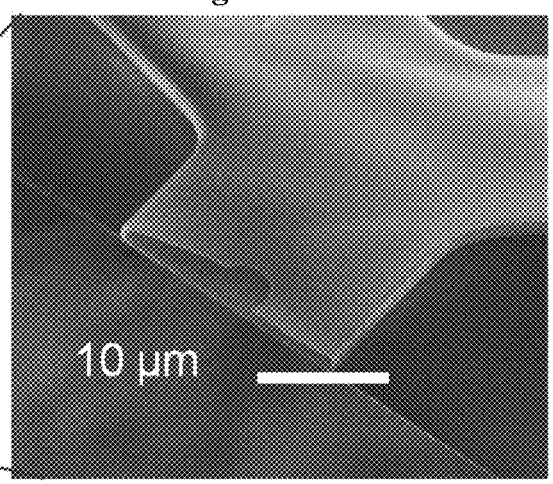
FIG. 17C is a SEM image illustrating the details of the cantilever edge in accordance with the disclosed subject matter.

FIG. 17C is a SEM image illustrating the details of the edge of the cantilever plate of FIGS. 17A-B. In particular, FIG. 17C is an enlarged view of portion 1702 of FIG. 17B. In the exemplary embodiment depicted by FIG. 17C, the layers can be approximately 60 nm thick and can be colored differently for clarity. In some embodiments, the plate height (e.g., the spacing between the two layers) can be 2 microns. In some embodiments, the plate height can vary slightly in a fully released structure.

FIG. 18 is a schematic diagram illustrating an exemplary process of fabricating two-layer plates. In some embodiments, the plates can be fabricated from ALD aluminum oxide (alumina) as illustrated in FIG. 18.

At step 1802, a 60-nm-thick planar layer of aluminum oxide ($Al_2O_3$) can be deposited on a cleaned double-side polished silicon wafer. In some embodiments, the deposition can be performed at 250° C. using water and trimethylaluminum precursors in the ALD tool. A sacrificial layer of amorphous silicon (hereinafter also referred to as "a-Si") can be deposited at 175° C. on the front side of the structure using plasma-enhanced chemical vapor deposition (hereinafter also referred to as "PECVD"). In some embodiments, the thickness of the a-Si layer, which can determine the height of the finished plate and the spacing between the ALD film layers, can be varied between 1 and 3 microns in different implementations of the fabrication process.

At step 1804, the a-Si layer can be patterned using photolithography and anisotropic reactive ion etching (hereinafter also referred to as "RIE") process to obtain the hexagonal honeycomb pattern shown in FIG. 17B. The hexagonal honeycomb geometry of the disclosed subject matter can be chosen because it exhibits approximately isotropic bending stiffness characteristics. Next, another 60 nm layer of ALD alumina can be deposited to form the corrugated layer.

At step 1806, the second ALD layer was can be patterned using photolithography and inductively coupled plasma (ICP) RIE to define the width and length of the cantilever and to open the etch holes for removing the a-Si sacrificial layer at step 1812.

At step 1808, an approximately 500 nm thick layer of silicon nitride can be deposited on the back side of the wafer and can be patterned to serve as a hard mask for KOH wet-etching.

At step 1810, the backside of the wafer can be etched in KOH. The backside etching can be stopped such that 10-50 μm of the backside silicon wafer are left (e.g., not etched away) under the ALD layers.

At step 1812, the fabricated device can be suspended using isotropic $XeF_2$ etching and/or isotropic $CF_4+O_2$ plasma RIE, which can also remove the sacrificial a-Si layer trapped between the ALD layers. The SEM image of FIG. 17C, confirms the presence of two alumina layers and the removal of the sacrificial layer.

In some embodiments, all of the trapped Si can be completely removed. Since the unique mechanical properties of plate mechanical metamaterials can depend on the extremely low thickness of the structural ALD layers, the trapped Si can be completely removed to provide minimal thickness and weight of the structural ALD layers. Any residual a-Si can change and/or affect the mechanical properties of the cantilevers, resulting in fracturing during sharp bending deformations. Accordingly, the a-Si can be etched until all optical and/or scanning electron micrographs indicate all a-Si has been removed and/or has disappeared. Since the ALD alumina can be highly transparent compared to a-Si, the presence of the a-Si can be easily detected in optical micrographs as illustrated in FIGS. 19A-B.

Figure 19A:
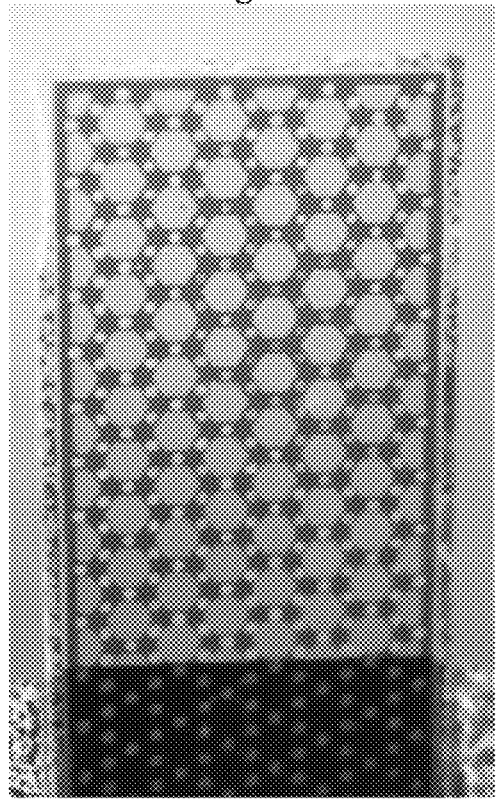
FIG. 19A depicts an optical microscope image of a partially etched cantilever in accordance with the disclosed subject matter.

FIG. 19A depicts an optical microscope image of a partially etched cantilever. The remaining a-Si trapped between the ALD alumina layers can appear to have a brown color in the partly etched cantilever.

Figure 19B:
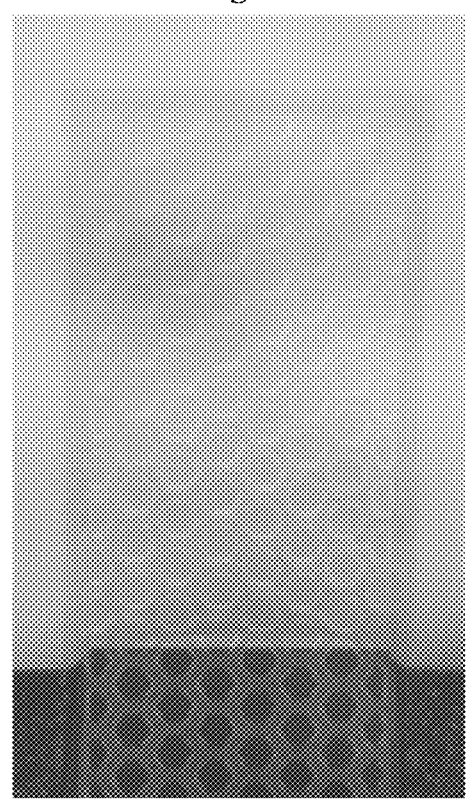
FIG. 19B depicts an optical microscope image of a fully etched cantilever in accordance with the disclosed subject matter.

FIG. 19B depicts an optical microscope image of a fully etched cantilever. In contrast to FIG. 19A, the completely etched cantilever without residual amorphous silicon can be completely clear and/or transparent.

EXAMPLE 2

The two-layer geometry for the plate mechanical metamaterials described above can be easier to realize using MEMS fabrication processes than the using an exact analog of a standard honeycomb sandwich composite, which can include two planar layers (e.g., faces) and a corrugated honeycomb layer in between them. However, based on results of finite element simulations and experiments, the stiffness of the two-layer structures can be comparable to that of a full honeycomb composite.

The small-deformation response of the two-layer plate structures was studied using the shell interface of a finite element analysis software (e.g., COMSOL Multiphysics). In the exemplary embodiment, the layers were modeled as alumina films with isotropic linear elastic properties, a Young's modulus of 130 GPa, and a Poisson ratio of 0.22. In the exemplary embodiment, mesh convergence was achieved using triangular elements with a minimum and maximum element size of 0.005 and 10 microns respectively. In the exemplary embodiment, geometric parameters in the simulation were set to coincide with the parameters of the cantilever used in the experiment(s). In the exemplary embodiment, in order to determine the spring constant of a cantilever and the corresponding bending stiffness of the plate material, one end of the cantilever was fixed while a normal, out-of-plane load was applied at the other end of the cantilever. In the exemplary embodiment, mirror symmetry condition was applied to the edges along the cantilever's length.

Figure 20:
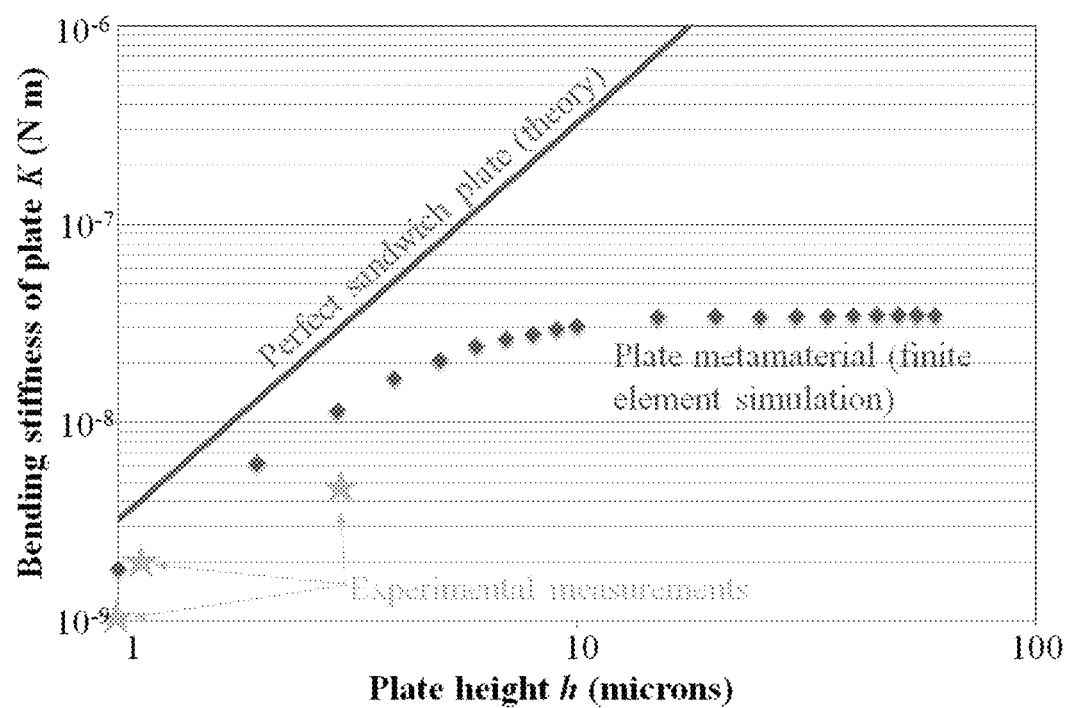
FIG. 20 is a graph comparing simulated effective bending stiffness of the two-layer honeycomb plates and that of a perfect sandwich plate as a function of the plate height in accordance with the disclosed subject matter.

FIG. 20 is a graph illustrating the bending stiffness $K_{eff}$ of two-layer plate metamaterial as predicted by the finite element simulations. FIG. 20 illustrates comparison results of the simulated effective bending stiffness of the two-layer plates and that of a perfect sandwich plate as a function of the plate height. In the embodiment shown in FIG. 20, the effective bending stiffness of the two-layer plate metamaterial can be simulated using finite element simulation. As illustrated by FIG. 20, the solid line shows the bending stiffness of a theoretically "perfect" sandwich plate of the same height (h) made from the films of the same thickness (t) calculated using the following formula: $K_{sandwich} \approx Yth^2/2$, where Y=130 GPa is the Young's modulus of the ALD aluminum oxide used in the embodiment illustrated by FIG. 20. The Young's modulus of ALD films can vary depending on the deposition parameters.

In some embodiments, the spring constant k of the cantilever with a width $W_{cant}$ and length $L_{cant}$ can be related to the plate bending stiffness by the formula $k=3W_{cant}K_{eff}/L_{cant}^3$. As illustrated by FIG. 20, the simulations show that for low heights, the bending stiffness of the fabricated two-layer plates can increase quadratically with an increase in values of the plate height, similar to the formula for ideal honeycomb sandwich plates (e.g., $K_{sandwich} \approx Yth^2/2$). In some embodiments, bending stiffness of the fabricated two-layer plates can also remain approximately a factor of two lower than the bending stiffness of a theoretically "perfect" sandwich plate (e.g., a plate consisting of two face sheets and a corrugated layer between them that completely prevents the lateral shear of the face sheets with respect to one another). In the exemplary embodiment, the bending stiffness of the fabricated two-layer plates can be lower than that of a theoretically "perfect" sandwich structure because the surface of the top layer of the fabricated plates is not "perfect" (e.g., not a continuous plane). For example, unlike the top layer of a theoretically "perfect" plate, the top layer of the fabricated plate can include etch holes and can be completely absent inside the hexagons. According to the exemplary embodiment, at heights above approximately 10 the bending stiffness can saturate as the vertical hexagonal walls that connect the top and bottom ALD layers can no longer prevent the shear of the top layer with respect to the bottom layer.

In some embodiments, even for relatively low heights (e.g., 1-3 μm), the bending stiffness of the two-layer plate mechanical metamaterial can be several orders of magnitude higher than that of single-layer plate mechanical metamaterials. As shown in FIG. 20, the effective bending stiffness is predicted to be between approximately $2\times10^{-9}$ N·m for a plate height of 1 μm and approximately $10^{-8}$ N·m for a plate height of 3 In contrast, single-layer plate metamaterials with similar in-plane geometry and a similar 60 nm thickness of the ALD film can have bending stiffness of only $3\times10^{-11}$ N·m. Accordingly, in the exemplary embodiment, by adding a second layer, 2-3 orders of magnitude improvement can be achieved in the bending stiffness of the plate material with a less than doubling of the mass per unit area. In the exemplary embodiment, the areal density of the two layer-structures can be readily measured using precise scales and/or calculated from the geometry and the density of the amorphous aluminum oxide ($p=4000$ kg/m$^3$) and can be approximately 0.5 gram per square meter.

In an exemplary embodiment, in order to validate the predictions of the finite element simulations, the spring constants of the cantilevers that were made from two-layer plate mechanical metamaterials of FIGS. 17A-C and FIG. 18 were determined. In particular, force-displacement curves were obtained at the tip of each cantilever using an Asylum atomic force microscope (AFM). Given the relatively low spring constants of the two-layer plates, soft AFM cantilever tips with spring constant values of $k_{AFM\ tip}$ value of approximately 0.01 N/m and 0.26 N/m were used. The spring constant values (e.g., $k_{AFM\ tip}$) can be determined using a thermal noise method. By modeling the plate as a spring in series with the AFM cantilever, it can be determined that the slope of the force displacement curve corresponds to the effective spring constant $K_{total}$, which satisfies the following formula: $k_{total}^{-1}=k_{AFM\ tip}^{-1}+k_{plate}^{-1}$. In the exemplary embodiment, by using this formula, the spring constants can be determined to have values of 1.5±0.3 mN/m and 5.4±1.1 mN/m for the 1 μm tall and 3 μm tall cantilevers, respectively. By using a cantilever having a width of $W_{cant}=0.45$ mm and a length of $L_{cant}=1$ mm, effective bending stiffness of the plate material can be determined using the following formula: $K_{eff}=kL^3_{cant}/3W_{cant}$, which can result in bending stiffness of the cantilevers used to have values of $(1.1\pm0.2)\times10$-9 N·m and $(4\pm1)\times10$-9 N·m for the 1 nm tall and 3 μm tall cantilevers, respectively.

Figure 21:
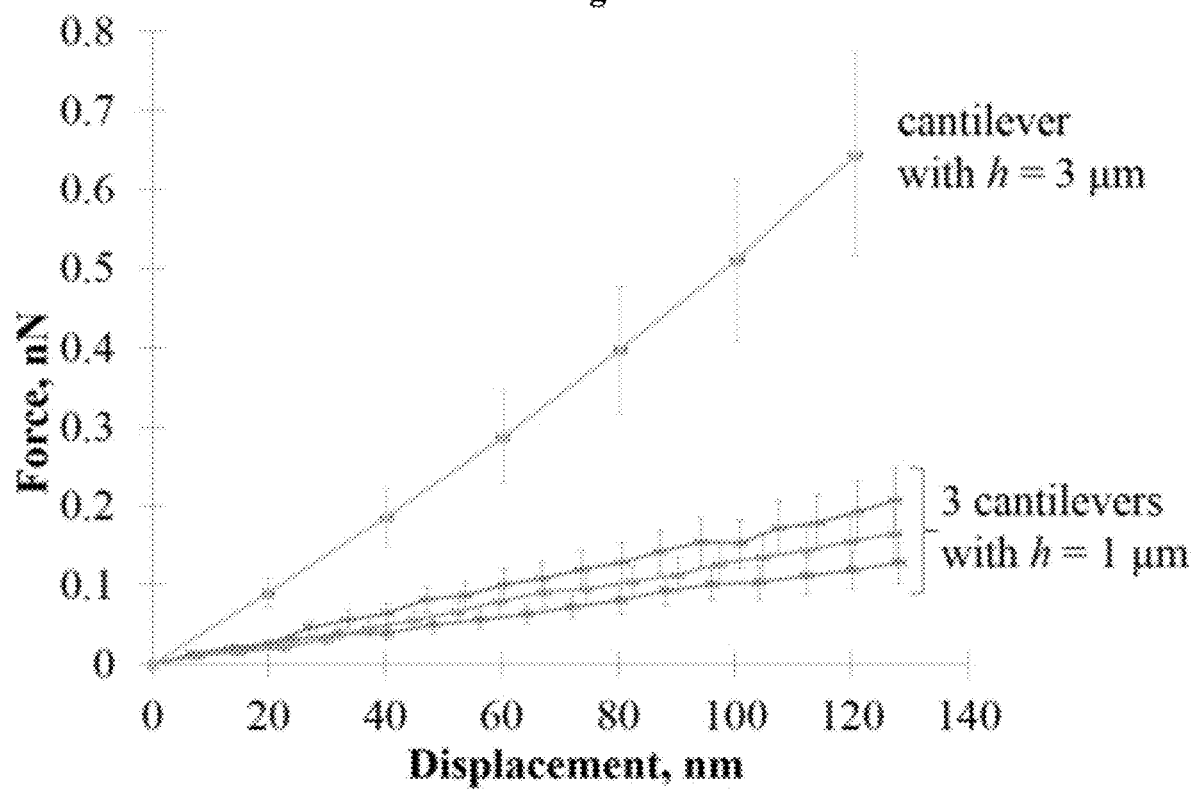
FIG. 21 is a graph comparing force-displacement curves of two-layer honeycomb plate cantilevers obtained at the tip of each cantilever using an atomic force microscope in accordance with the disclosed subject matter.

FIG. 21 is a graph comparing force-displacement curves of the two-layer plate cantilevers obtained at the tip of each cantilever using an atomic force microscope. In the exemplary embodiment depicted by FIG. 21, the 1 μm tall cantilevers were measured using an AFM tip having a $K_{AFM\ tip}$ value of approximately 0.01 N/m, while the 3 μm tall cantilever was measured using an AFM tip having a $K_{AFM\ tip}$ value of approximately 0.26 N/m. As illustrated by FIG. 21, the measured bending stiffness of the fabricated cantilevers can be approximately a factor of two in value lower than the values predicted by finite element simulation. Such a difference from the simulation results can occur because the actual spacing between the top and bottom layers is lower in the experimental fully released devices than the nominal design values. Despite this difference in values of the measured bending stiffness of the experimental cantilevers from the simulation results, the experimental results shown in FIG. 21 can confirm the predicted trend of bending stiffness increasing with an increase in plate height. In some embodiments, structures can be fabricated with even larger heights to show that the bending stiffness saturates at large heights.

Figure 22A:
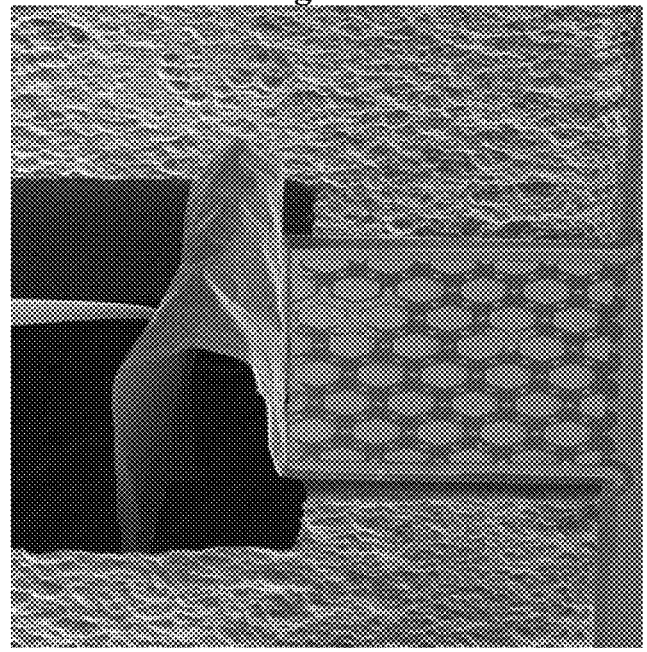
FIG. 22A is a SEM image of a two-layer honeycomb cantilever that is bent in accordance with the disclosed subject matter.

In some embodiments, the two-layer plates can sustain sharp bending without permanent deformation. In an exemplary embodiment, the mechanical robustness of the two-layer plates was observed using a micromanipulator probe while imaging the device in an FEI Strata focused ion beam (FIB) tool. FIG. 22A illustrates a SEM image of a cantilever that is bent.

Figure 22B:
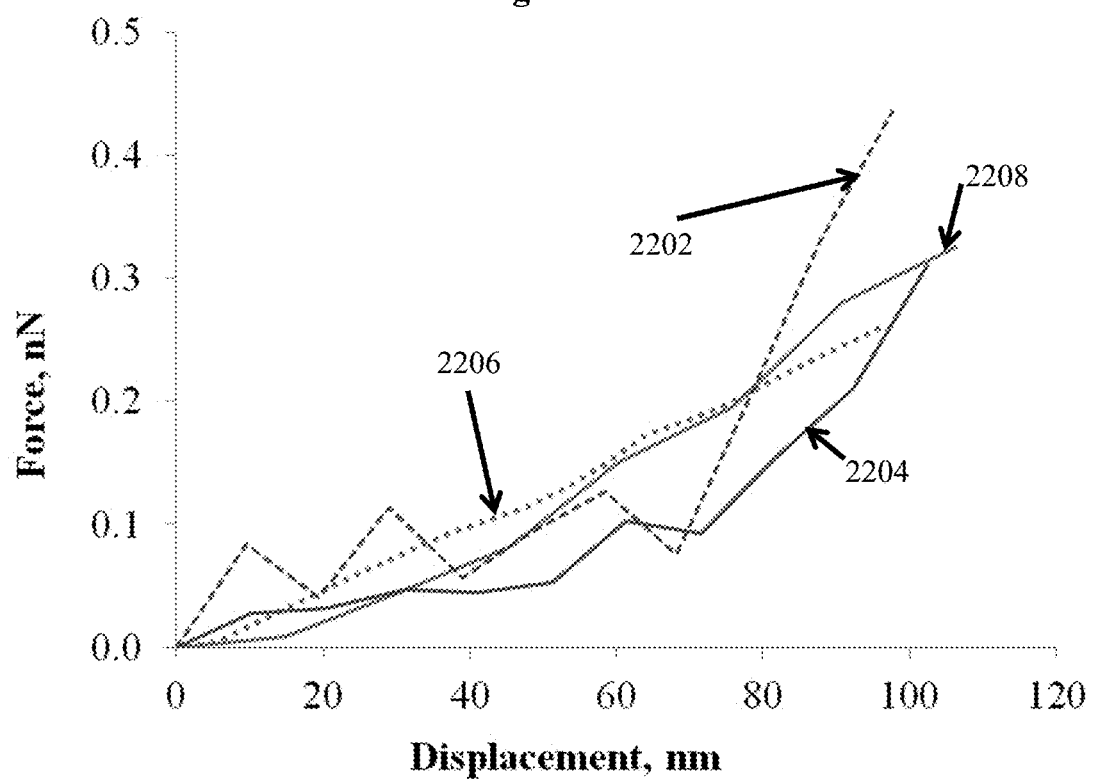
FIG. 22B is a graph comparing the results of force-displacement curves different two-layer honeycomb plate cantilevers that are bent as shown in FIG. 22A in accordance with the disclosed subject matter.

FIG. 22B is a graph comparing the results of force-displacement curves for two separate two-layer plate cantilevers with the same geometrical parameters before and after the cantilevers are sharply bent as shown in FIG. 22A. Line 2204 and 2208 show measurement results of a first and second experimental two-layer plate cantilever before the sharp bending. As shown in FIG. 22B, the two cantilever show identical response within the scope of measurement error. Lines 2204 and 2208 show measurement results of the two two-layer plate cantilevers after the sharp bending as shown in FIG. 22A. As illustrated by FIG. 22B, neither of the two cantilevers softens after sharp bending, which is different from the behavior of macro-scale corrugated cardboard and/or honeycomb sandwich composite plates, for which crease and/or fold lines are permanently weakened after being subjected to sharp bending.

Figure 23A:
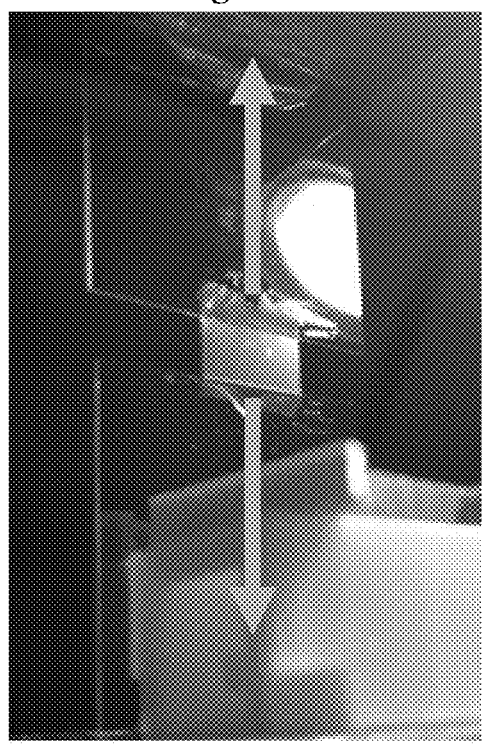
FIG. 23A depicts a test apparatus for performing tensile measurements on the disclosed one-layer or two-layer plates in accordance with the disclosed subject matter.

FIG. 23A depicts a test apparatus for performing tensile measurements on the disclosed single-layer and/or mutilayer plates. As shown in FIG. 23A, a standard materials testing tool (e.g., Instron 5564) can be used to perform the tensile measurements on the nanoscale plates.

Figure 23B:
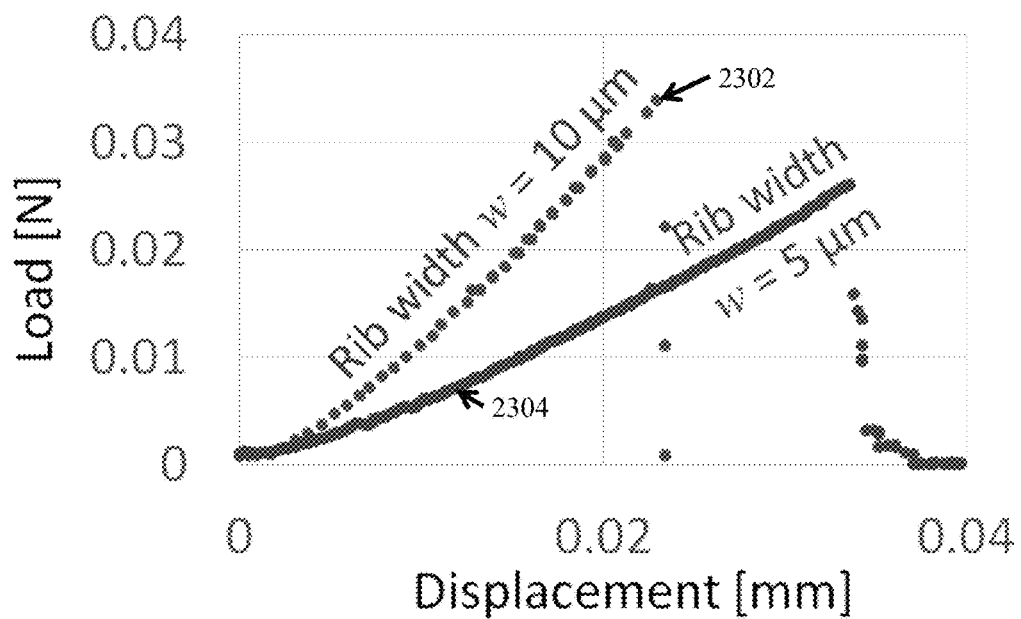
FIG. 23B is a graph comparing the results of force-displacement curves of two different one-layer plate cantilevers having different rib widths in accordance with the disclosed subject matter.

FIG. 23B is a graph comparing the results of force-displacement curves of two different single-layer plates having different rib widths. Line 2302 shows measurement results of a first single-layer plate cantilever having rib width of 10 μm and line 2304 shows measurement results of a second single-layer plate cantilever having rib width of 5 μm. In some embodiments, the corrugated single-layer plates can be approximately 20 times softer under tension than completely planar plates despite being approximately 30 times stiffer than completely planar plates under bending. In some embodiments, the single-layer plates can break at an overall elongation of approximately 1%. According to simulation results, the peak local strain can be coincidentally also about 1%. In some embodiments, the tensile stiffness of multi-layer plates that are stacked from two single-layer corrugated plates can be the sum of the tensile stiffnesses of the constituent plates. Accordingly, the tensile stiffness can scale linearly with the number of constituent plates. The bending stiffness of multi-layer plates can scale quadratically with the overall height of the multilayer plate, and accordingly can scale quadratically with the number of constituent plates.

Figure 24:
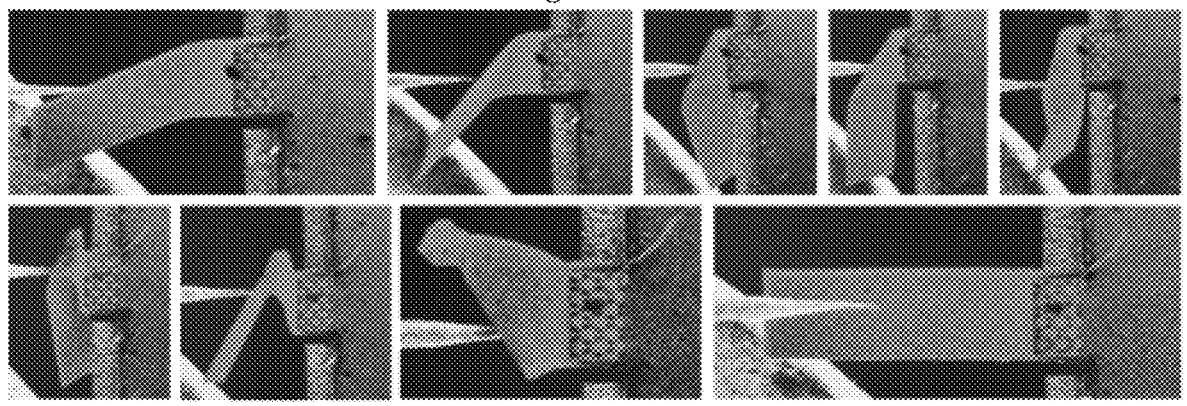
FIG. 24 illustrates a set of sequential SEM screenshots showing a two-layer cantilevered plate undergoing bending deformations and recovering its original shape in accordance with the disclosed subject matter.
Figure 25A:
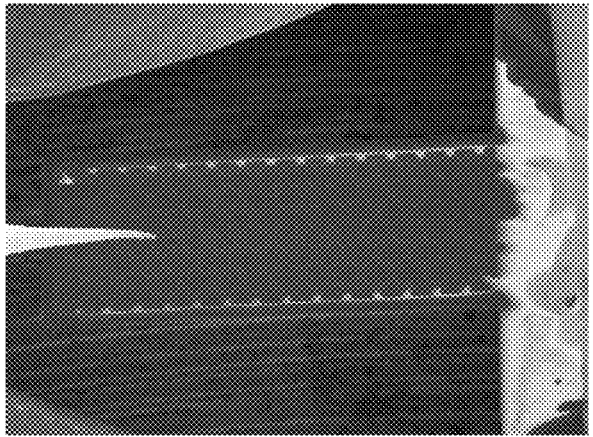
FIGS. 25A-F illustrates a set of sequential SEM screenshots showing a two-layer cantilevered plate undergoing bending deformations and recovering its original shape in accordance with the disclosed subject matter.
Figure 25B:
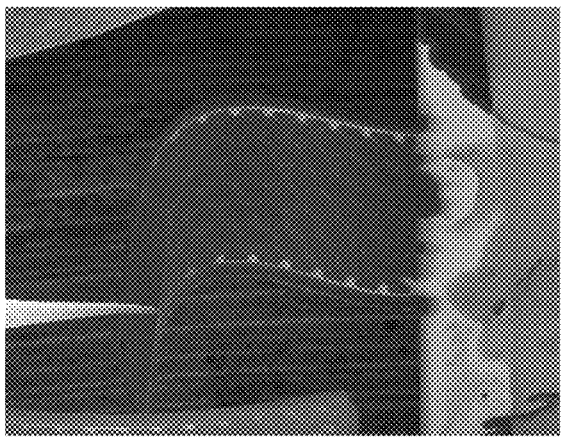
Figure 25C:
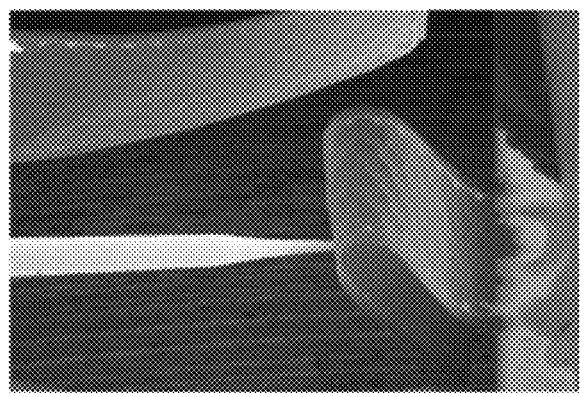
Figure 25D:
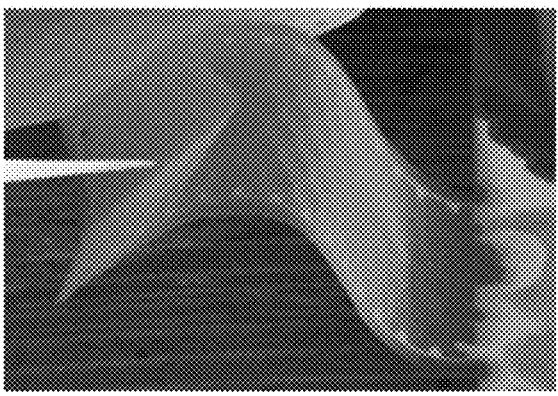
Figure 25E:
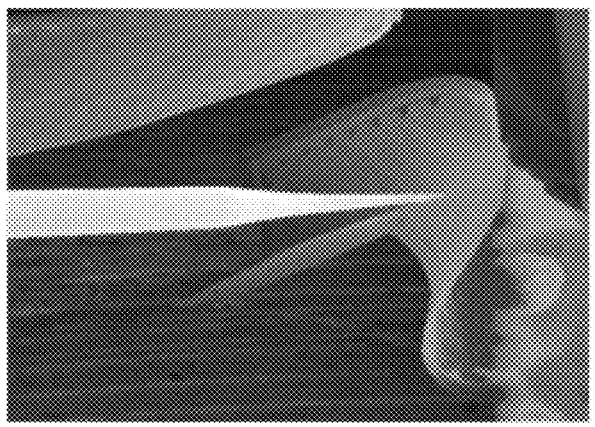
Figure 25F:
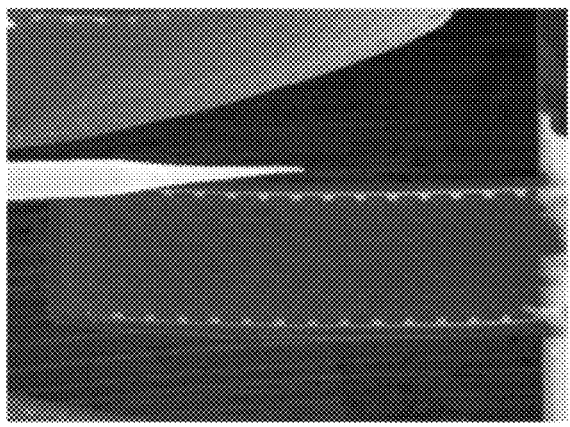

FIG. 24 illustrates a set of sequential SEM screenshots showing a 1 μm tall two-layer cantilevered plate undergoing bending deformations and recovering its original shape. Similar to single-layer plates, the two-layer plates in the exemplary embodiment illustrated by FIG. 24 showed the ability to recover from several deformations without any apparent fracture and/or permanent deformation. This is very different from the behavior of macroscale multilayer composites, such as honeycomb sandwich plates, which can fracture, delaminate, or irreversibly buckle after being subjected to the sharp bending to which the two-layer cantilever plate illustrated in this exemplary embodiment were subjected.

In some embodiments, macroscopic sandwich plates that undergo very sharp bends can be expected to develop strains of the order of 1 unless the structure of plate changes. Accordingly, experimental sandwich plates undergoing sharp bending or folding can either fracture completely and/or irreversibly change their structure. For example, the face sheets of a sandwich composite can delaminate from the hexagonal webbing that connects the two face sheets. Additionally or alternatively, the hexagonal webbing can be crumpled by irreversible buckling. In any of these scenarios, the sandwich plate can remain permanently deformed and weakened in the area that has been subjected to sharp bending and/or folding.

FIGS. 25A-F illustrates a set of sequential SEM screenshots showing a 2 μm two-layer cantilevered plate undergoing bending deformations and recovering its original shape. As illustrated by FIGS. 25A-F, after the recovery, the two-layer plate did not display any signs of damage even in high-resolution SEM images of the areas where sharp folding occurred. For example, the high resolution scanning electron micrographs illustrated in FIGS. 25A-F do not reveal any evidence of irreversible changes after extreme bending of our two-layer plates. While the two-layer plates can change their internal structure by locally buckling the vertical walls during sharp bending, the deformations appear to be fully elastic, reversing after the external force is removed. Similar recoverable deformations can be observed in "bulk mechanical metamaterials" and, in particular, nano-lattices created using ultrathin ALD aluminum oxide.

In some embodiments, the bending stiffness of two-layer plates can be increased by 2-3 orders of magnitude relative to single-layer plates. In some embodiments, the bending stiffness of two-layer plates can within a factor of two of that of a theoretically "ideal" and/or "perfect" sandwich plate. In some embodiments, the two-layer plates can have ultralow areal density (e.g., approximately 0.5 gram per square meter) and can be made using a relatively high-throughput fabrication method that can be easily scaled to cm-scale plates. In some embodiments, the two-layer plate mechanical metamaterials can pop back elastically to their original position after extremely sharp bending deformations without any apparent damage unlike macroscopic sandwich composites, which typically fracture, delaminate, or irreversibly buckle after sharp bending. The observed robustness and the apparent lack of irreversible deformation can be a result of reversible buckling of ultrathin structures.

Ultralow weight, mechanical robustness, thermal insulation, as well as chemical and thermal stability of alumina can make single-layer and multi-layer plate metamaterials attractive for numerous applications, including structural elements in flying microrobots, high-temperature thermal and electrical insulation in energy converters, including thermionic converters and thermophotovoltaic converters, testing of nanoscale strength enhancement, new types of optical and acoustic metamaterials, as well as ultra-lightweight hollow MEMS sensors and resonators. In some embodiments, the disclosed single-layer and multi-layer plate metamaterials can be used as films for high-frequency microphones and/or acoustic metamaterials. For example, high-fidelity ribbon microphones that are fabricated with the disclosed light two-layer plate metamaterial can be operated above 100 kHz. In some embodiments, the disclosed single-layer and multi-layered plates can produce microstructures for acoustic insulation and/or filtering. In some embodiments, the disclosed single-layer and multi-layered plates can be used as materials for microflyers and/or robots with continuous membranes. For example, the disclosed single-layer or two-layered plates can be used to create wings more than an order of magnitude thinner and lighter than any wings created by nature (e.g., approximately 10 μm) and/or by man (>0.5 μm) to date.

Figure 26:
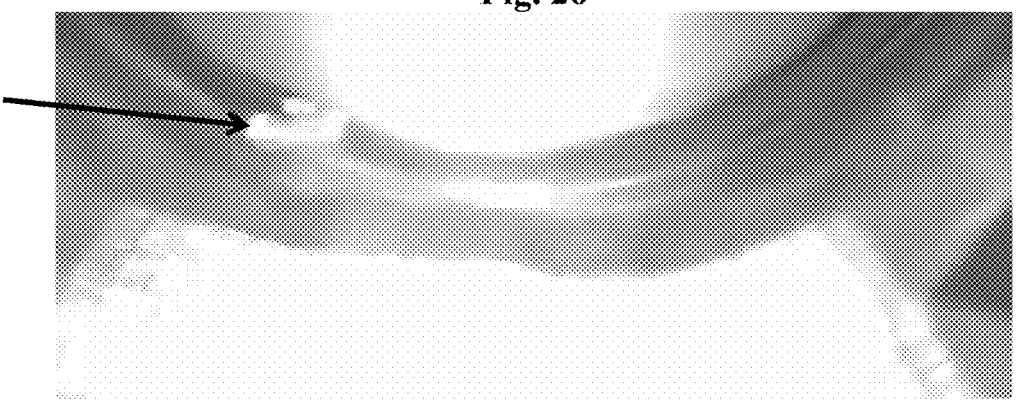
FIG. 26 illustrates a stack of two single-layer plates levitating in mid-air in response to being subjected to light from a light-emitting-diode array in accordance with the disclosed subject matter.

In some embodiments, the disclosed single-layer and multi-layered plates can be used for applications that use levitation and propulsion using Knudsen force. Knudsen force exist on plates that have different temperatures on the two opposite sides. The Knudsen force can be a strong enough force to allow vanes to rotate on a low-friction bearing. However, Knudsen forces are approximately 100 times weaker than the amount of force needed to overcome gravity and allow certain objects (e.g. paper and/or solid plate) levitate. Since the disclosed two-layered plates are thousands times lighter (e.g., less dense) than paper but can maintain a large temperature difference between the two sides when illuminated by a heat and/or light source (e.g., laser pointer, light-emitting diode, and/or natural sunlight), the disclosed two-layered plates can levitate when illuminated by the heat and/or light source as illustrated in FIG. 26. FIG. 26 illustrates the disclosed two-layered plate 2602 levitating in mid-air in response to being subjected to the light from an array of light-emitting diodes.

The description herein merely illustrates the principles of the disclosed subject matter. Various modifications and alterations to the described embodiments will be apparent to those skilled in the art in view of the teachings herein. Accordingly, the disclosure herein is intended to be illustrative, but not limiting, of the scope of the disclosed subject matter.

The invention claimed is:

1. A plate structure comprising:
   a corrugated single-layer plane including
      a planar base portion; and
      an out-of-plane rib portion forming at least one strengthening rib, wherein the at least one strengthening rib is formed such that there is no straight line path extending through the height or width of the plate structure that does not intersect the planar base portion and the at least one strengthening rib, wherein the plate structure is configured to revert to its original shape by local buckling of the at least one strengthening rib after being bent, and
   wherein the plate structure has a thickness between about 1 nm and about 1000 nm.

2. The plate structure of claim 1 wherein the plate structure comprises a metal or ceramic.

3. The plate structure of claim 2 wherein the plate structure comprises at least one of alumina and hafnia.

4. The plate structure of claim 1 wherein the plate structure has a thickness of between about 20 nm and about 75 nm.

5. The plate structure of claim 1 wherein the plate structure has a lateral dimension of at least about 1 cm.

6. The plate structure of claim 1, wherein the at least one strengthening rib forms a honeycomb pattern.

7. The plate structure of claim 1, wherein the planar base portion and out-of-plane rib portion are formed by atomic layer deposition.

8. A plate structure comprising a plurality of cells, each cell comprising a planar base portion and at least one out-of-plane rib portion, the at least one out-of-plane rib portion connected to out-of-plane rib portions of adjacent cells to form at least one strengthening rib,
   wherein the at least one strengthening rib is formed such that there is no straight line path extending through the height or width of the plate structure that does not intersect the planar base portion of at least one cell and the at least one strengthening rib, and
   wherein the plate structure is a corrugated structure and has a thickness between about 1 nm and about 500 nm, wherein the plate structure is configured to revert to its original shape by local buckling of the at least one strengthening rib after being bent.

9. The plate structure of claim 8, wherein each of the plurality of cells has the same shape.

10. The plate structure of claim 8, wherein each of the plurality of cells comprises a honeycomb cell.

11. The plate structure of claim 8, wherein the plurality of cells comprises a first plurality of cells having a first shape and a second plurality of cells having a second shape.

12. The plate structure of claim 8, wherein each cell comprises at least one of alumina and hafnia.

13. The plate structure of claim 8, wherein each of the plurality of cells is formed by atomic layer deposition.

* * * * *